(12) United States Patent
Lei et al.

(10) Patent No.: US 10,703,915 B2
(45) Date of Patent: Jul. 7, 2020

(54) COMPOSITIONS AND METHODS FOR THE DEPOSITION OF SILICON OXIDE FILMS

(71) Applicant: Versum Materials US, LLC, Tempe, AZ (US)

(72) Inventors: Xinjian Lei, Vista, CA (US); Meiliang Wang, Carlsbad, CA (US); Matthew R. MacDonald, Laguna Niguel, CA (US); Richard Ho, Anaheim, CA (US); Manchao Xiao, San Diego, CA (US); Suresh Kalpatu Rajaraman, San Marcos, CA (US)

(73) Assignee: VERSUM MATERIALS US, LLC, Tempe, AZ (US)

( * ) Notice: Subject to any disclaimer, the term of this patent is extended or adjusted under 35 U.S.C. 154(b) by 0 days.

(21) Appl. No.: 15/698,794

(22) Filed: Sep. 8, 2017

(65) Prior Publication Data

US 2018/0127592 A1 May 10, 2018
US 2020/0040192 A9 Feb. 6, 2020

Related U.S. Application Data

(60) Provisional application No. 62/408,167, filed on Oct. 14, 2016, provisional application No. 62/396,410, filed on Sep. 19, 2016, provisional application No. 62/417,619, filed on Nov. 4, 2016.

(51) Int. Cl.
| | | |
|---|---|---|
| *C23C 16/40* | (2006.01) | |
| *C23C 16/455* | (2006.01) | |
| *C09D 1/00* | (2006.01) | |
| *C01B 33/12* | (2006.01) | |
| *C07F 7/02* | (2006.01) | |
| *C07F 7/10* | (2006.01) | |

(52) U.S. Cl.
CPC .............. *C09D 1/00* (2013.01); *C01B 33/126* (2013.01); *C07F 7/025* (2013.01); *C07F 7/10* (2013.01); *C23C 16/401* (2013.01); *C23C 16/402* (2013.01); *C23C 16/45527* (2013.01); *C23C 16/45536* (2013.01); *C23C 16/45542* (2013.01); *C23C 16/45553* (2013.01); *C01P 2002/54* (2013.01); *C01P 2006/10* (2013.01)

(58) Field of Classification Search
CPC ....... C23C 16/45525; C23C 16/45536–45542; C23C 16/402
USPC .................................................. 427/569–579
See application file for complete search history.

(56) References Cited

U.S. PATENT DOCUMENTS

| | | |
|---|---|---|
| 5,424,095 A | 6/1995 | Clark et al. |
| 7,084,076 B2 | 8/2006 | Park et al. |
| 2010/0164057 A1* | 7/2010 | Hunks ............... H01L 21/02123 257/520 |
| 2012/0291321 A1 | 11/2012 | Spiro |
| 2013/0295779 A1* | 11/2013 | Chandra ............... C23C 16/402 438/790 |
| 2015/0087139 A1 | 3/2015 | O'Neill et al. |
| 2015/0275355 A1* | 10/2015 | Mallikarjunan .......... C07F 7/10 427/579 |
| 2016/0276148 A1* | 9/2016 | Qian .................. H01J 37/32899 |

FOREIGN PATENT DOCUMENTS

| | | |
|---|---|---|
| JP | 2010225663 A2 | 10/2010 |
| JP | 2010275602 A2 | 12/2010 |

OTHER PUBLICATIONS

Burton, B. B., et al., "SiO2 Atomic Layer Deposition Using Tris(dimethylamino)silane and Hydrogen Peroxide Studied by in Situ Transmission FTIR Spectroscopy", J. Phys. Chem. C 2009, 113, pp. 8249-8257.

Abel, E. W., et al., "Some New Alkylaminosilanes", J. Org. Chem., 1961, 26, 4638, pp. 1528-1530.

* cited by examiner

*Primary Examiner* — Elizabeth A Burkhart
(74) *Attorney, Agent, or Firm* — David K. Benson

(57) ABSTRACT

Described herein are compositions and methods for forming silicon oxide films. In one aspect, the film is deposited from at least one silicon precursor compound, wherein the at least one silicon precursor compound is selected from the following Formulae A and B:

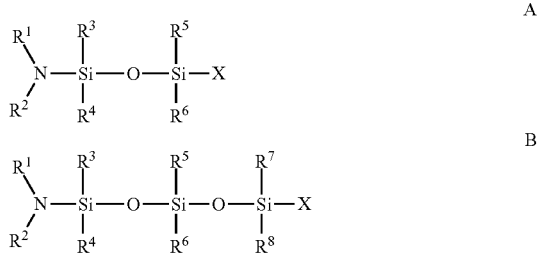

as defined herein.

26 Claims, No Drawings

COMPOSITIONS AND METHODS FOR THE DEPOSITION OF SILICON OXIDE FILMS

CROSS REFERENCE TO RELATED APPLICATIONS

This application claims the benefit of priority under 35 U.S.C. § 119(e) to U.S. provisional patent application No. 62/396,410, filed on Sep. 19, 2016, U.S. provisional patent application No. 62/408,167, filed on Oct. 14, 2016, and U.S. provisional patent application No. 62/417,619, filed on Nov. 4, 2016, the entireties of which are incorporated herein by reference.

BACKGROUND OF THE INVENTION

Described herein are compositions and methods for the formation of silicon and oxide containing films. More specifically, described herein are compositions and methods for formation of stoichiometric or non-stoichiometric silicon oxide films or material at one or more deposition temperatures of about 300° C. or less or, more specifically, ranging from about 25° C. to about 300° C.

Atomic Layer Deposition (ALD) and Plasma Enhanced Atomic Layer Deposition (PEALD) are processes used to deposit conformal silicon oxide film at low temperatures (<500° C.). In both ALD and PEALD processes, the precursors and reactive gases (such as oxygen or ozone) are separately pulsed in certain number of cycles to form a monolayer of silicon oxide at each cycle. However, silicon oxide deposited at low temperatures using these processes may contain levels of impurities such as, without limitation, nitrogen (N) which may be detrimental in certain semiconductor applications. To remedy this, one possible solution is to increase the deposition temperature to 500° C. or greater. However, at these higher temperatures, conventional precursors employed by semi-conductor industries tend to self-react, thermally decompose, and deposit in a chemical vapor deposition (CVD) mode rather than an ALD mode. The CVD mode deposition has reduced conformality compared to ALD deposition, especially for high aspect ratio structures which are needed in many semiconductor applications. In addition, the CVD mode deposition has less control of film or material thickness than the ALD mode deposition.

The reference article entitled "Some New Alkylaminosilanes", Abel, E. W. et al., J. Chem. Soc., (1961), Vol. 26, pp. 1528-1530 describes the preparation of various aminosilane compounds such as $Me_3SiNHBu$-iso, $Me_3SiNHBu$-sec, $Me_3SiN(Pr$-iso$)_2$, and $Me_3SiN(Bu$-sec$)_2$ wherein Me=methyl, Bu-sec=sec-butyl, and Pr-iso=isopropyl from the direct interaction of trimethylchlorosilane ($Me_3SiCl$) and the appropriate amine.

The reference article entitled "$SiO_2$ Atomic Layer Deposition Using Tris(dimethylamino)silane and Hydrogen Peroxide Studied by in Situ Transmission FTIR Spectroscopy", Burton, B. B., et al., The Journal of Physical Chemistry (2009), Vol. 113, pp. 8249-57 describes the atomic layer deposition (ALD) of silicon dioxide ($SiO_2$) using a variety of silicon precursors with $H_2O_2$ as the oxidant. The silicon precursors were (N,N-dimethylamino)trimethylsilane) $(CH_3)_3SiN(CH_3)_2$, vinyltrimethoxysilane $CH_2CHSi(OCH_3)_3$, trivinylmethoxysilane $(CH_2CH)_3SiOCH_3$, tetrakis(dimethylamino)silane $Si(N(CH_3)_2)_4$, and tris(dimethylamino)silane (TDMAS) $SiH(N(CH_3)_2)_3$. TDMAS was determined to be the most effective of these precursors. However, additional studies determined that SiH* surface species from TDMAS were difficult to remove using only $H_2O$. Subsequent studies utilized TDMAS and $H_2O_2$ as the oxidant and explored $SiO_2$ ALD in the temperature range of 150-550° C. The exposures required for the TDMAS and $H_2O_2$ surface reactions to reach completion and were monitored using in situ FTIR spectroscopy. The FTIR vibrational spectra following the TDMAS exposures showed a loss of absorbance for O—H stretching vibrations and a gain of absorbance for C-Hx and Si—H stretching vibrations. The FTIR vibrational spectra following the $H_2O_2$ exposures displayed a loss of absorbance for C-Hx and Si—H stretching vibrations and an increase of absorbance for the O—H stretching vibrations. The SiH* surface species were completely removed only at temperatures >450° C. The bulk vibrational modes of $SiO_2$ were observed between 1000-1250 cm$^{-1}$ and grew progressively with number of TDMAS and $H_2O_2$ reaction cycles. Transmission electron microscopy (TEM) was performed after 50 TDMAS and $H_2O_2$ reaction cycles on $ZrO_2$ nanoparticles at temperatures between 150-550° C. The film thickness determined by TEM at each temperature was used to obtain the $SiO_2$ ALD growth rate. The growth per cycle varied from 0.8 Å/cycle at 150° C. to 1.8 Å/cycle at 550° C. and was correlated with the removal of the SiH* surface species. $SiO_2$ ALD using TDMAS and $H_2O_2$ should be valuable for $SiO_2$ ALD at temperatures >450° C.

JP2010275602 and JP2010225663 disclose the use of a raw material to form a Si containing thin film such as, silicon oxide, by a chemical vapor deposition (CVD) process at a temperature range of from 300-500° C. The raw material is an organic silicon compound, represented by formula: (a) $HSi(CH_3)(R^1)(NR^2R^3)$, wherein, $R^1$ represents $NR^4R^5$ or a 1C-5C alkyl group; $R^2$ and $R^4$ each represent a 1C-5C alkyl group or hydrogen atom; and $R^3$ and $R^5$ each represent a 1C-5C alkyl group); or (b) $HSiCl(NR^1R^2)(NR^3R^4)$, wherein $R^1$ and $R^3$ independently represent an alkyl group having 1 to 4 carbon atoms, or a hydrogen atom; and $R^2$ and $R^4$ independently represent an alkyl group having 1 to 4 carbon atoms. The organic silicon compounds contained H—Si bonds.

U.S. Pat. No. 5,424,095 describes a method to reduce the rate of coke formation during the industrial pyrolysis of hydrocarbons, the interior surface of a reactor is coated with a uniform layer of a ceramic material, the layer being deposited by thermal decomposition of a non-alkoxylated organosilicon precursor in the vapor phase, in a steam containing gas atmosphere in order to form oxide ceramics.

U. S. Publ. No. 2012/0291321 describes a PECVD process for forming a high-quality Si carbonitride barrier dielectric film between a dielectric film and a metal interconnect of an integrated circuit substrate, comprising the steps of: providing an integrated circuit substrate having a dielectric film or a metal interconnect; contacting the substrate with a barrier dielectric film precursor comprising: $R_xR_y(NRR')_zSi$ wherein R, R', R and R' are each individually selected from H, linear or branched saturated or unsaturated alkyl, or aromatic group; wherein x+y+z=4; z=1 to 3; but R, R' cannot both be H; and where z=1 or 2 then each of x and y are at least 1; forming the Si carbonitride barrier dielectric film with C/Si ratio >0.8 and a N/Si ratio >0.2 on the integrated circuit substrate.

U. S. Publ. No. 2013/0295779 A describes an atomic layer deposition (ALD) process for forming a silicon oxide film at a deposition temperature >500° C. using silicon precursors having the following formula:

I.

wherein $R^1$, $R^2$, and $R^3$ are each independently selected from hydrogen, a linear or branched $C_1$ to $C_{10}$ alkyl group, and a $C_6$ to $C_{10}$ aryl group; $R^4$ is selected from, a linear or branched $C_1$ to $C_{10}$ alkyl group, and a $C_6$ to $C_{10}$ aryl group, a $C_3$ to $C_{10}$ alkylsilyl group; wherein $R^3$ and $R^4$ are linked to form a cyclic ring structure or $R^3$ and $R^4$ are not linked to form a cyclic ring structure; X is a halide selected from the group consisting of Cl, Br and I; m is 0 to 3; n is 0 to 2; and p is 0 to 2 and m+n+p=3; and

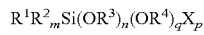   II.

wherein $R^1$ and $R^2$ are each independently selected from hydrogen, a linear or branched $C_1$ to $C_{10}$ alkyl group, and a $C_6$ to $C_{10}$ aryl group; $R^3$ and $R^4$ are each independently selected from a linear or branched $C_1$ to $C_{10}$ alkyl group, and a $C_6$ to $C_{10}$ aryl group; wherein $R^3$ and $R^4$ are linked to form a cyclic ring structure or $R^3$ and $R^4$ are not linked to form a cyclic ring structure; X is a halide atom selected from the group consisting of Cl, Br and I; m is 0 to 3; n is 0 to 2; q is 0 to 2 and p is 0 to 2 and m+n+q+p=3

U.S. Pat. No. 7,084,076 discloses a halogenated siloxane such as hexachlorodisiloxane (HCDSO) that is used in conjunction with pyridine as a catalyst for ALD deposition below 500° C. to form silicon dioxide.

U.S. Pat. No. 6,992,019 discloses a method for catalyst-assisted atomic layer deposition (ALD) to form a silicon dioxide layer having superior properties on a semiconductor substrate by using a first reactant component consisting of a silicon compound having at least two silicon atoms, or using a tertiary aliphatic amine as the catalyst component, or both in combination, together with related purging methods and sequencing. The precursor used is hexachlorodisilane. The deposition temperature is between 25-150° C.

The disclosures of the previously identified patents, patent applications and other publications are hereby incorporated by reference.

The above-mentioned prior art, however, still suffers from certain drawbacks as there still remains a need to develop a process for forming a silicon oxide film having at least one or more of the following attributes: a density of about 2.1 g/cc or greater, a growth rate of 1.0 Å/cycle or greater during the deposition, low chemical impurity, and/or high conformality in a thermal atomic layer deposition, a plasma enhanced atomic layer deposition (ALD) process or a plasma enhanced ALD-like process using cheaper, reactive, and more stable silicon precursor compounds. In addition, there is a need to develop precursors that can provide tunable films for example, ranging from silicon oxide to carbon doped silicon oxide.

BRIEF SUMMARY OF THE INVENTION

Described herein is a process for the deposition of a stoichiometric or nonstoichiometric silicon oxide material or film, such as without limitation, a silicon oxide, a carbon doped silicon oxide, a silicon oxynitride film, or a carbon doped silicon oxynitride film at relatively low temperatures, e.g., at one or more temperatures of 300° C. or lower or, in other embodiments, at relatively high temperatures, e.g., at one or more temperatures of 600° C. or higher, in a plasma enhanced ALD, plasma enhanced cyclic chemical vapor deposition (PECCVD), a plasma enhanced ALD-like process, or an ALD process with oxygen-containing reactant source.

In one aspect, there is provided a method to deposit a film comprising silicon and oxide onto a substrate which comprises the steps of:

a) providing a substrate in a reactor;
b) introducing into the reactor at least one silicon precursor compound, wherein the at least one silicon precursor compound has at least one Si—O—Si linkages is selected from the group consisting of Formulae A and B:

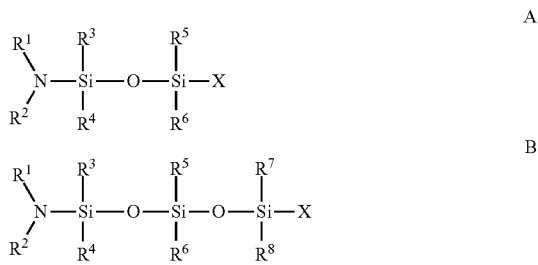

wherein $R^1$ is independently selected from a linear $C_1$ to $C_{10}$ alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group; $R^2$ is selected from the group consisting of hydrogen, a $C_1$ to $C_{10}$ linear alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group, wherein $R^1$ and $R^2$ in Formula A or B are either linked to form a cyclic ring structure or are not linked to form a cyclic ring structure; $R^{3-8}$ are each independently selected from hydrogen, a linear $C_1$ to $C_{10}$ alkyl group, a branched $C_3$ to $C_{10}$ alkyl group, a $C_3$ to $C_{10}$ cyclic alkyl group, a $C_2$ to $C_{10}$ alkenyl group, a $C_2$ to $C_{10}$ alkynyl group, and a $C_4$ to $C_{10}$ aryl group; X is selected from the group consisting of hydrogen, a linear $C_1$ to $C_{10}$ alkyl group, a branched $C_3$ to $C_{10}$ alkyl group, a $C_3$ to $C_{10}$ cyclic alkyl group, a $C_2$ to $C_{10}$ alkenyl group, a $C_2$ to $C_{10}$ alkynyl group, a $C_4$ to $C_{10}$ aryl group, halide (Cl, Br, I), and $NR^9R^{10}$ where $R^9$ and $R^{10}$ are each independently selected from hydrogen, a $C_1$ to $C_6$ linear alkyl group, a branched $C_3$ to $C_6$ alkyl group, a $C_3$ to $C_{10}$ cyclic alkyl group, a $C_3$ to $C_{10}$ alkenyl group, a $C_3$ to $C_{10}$ alkynyl group, and a $C_4$ to $C_{10}$ aryl group, wherein $R^9$ and $R^{10}$ are either linked to form a cyclic ring structure or are not linked to form a cyclic ring structure, and wherein $R^1$ and $R^9$ are either linked to form a cyclic ring or are not linked to form a cyclic ring;

c) purging the reactor with a purge gas;
d) introducing an oxygen-containing source into the reactor; and
e) purging the reactor with the purge gas, wherein the steps b through e are repeated until a desired thickness of film is deposited; and wherein the method is conducted at one or more temperatures ranging from about 25° C. to 600° C.

In this or other embodiments, the oxygen-containing source is a source selected from the group consisting of an oxygen plasma, ozone, a water vapor, water vapor plasma, nitrogen oxide (e.g., $N_2O$, NO, $NO_2$) plasma with or without inert gas, a carbon oxide (e.g., $CO_2$, CO) plasma and combinations thereof. In certain embodiments, the oxygen-containing source further comprises an inert gas. In these embodiments, the inert gas is selected from the group consisting of argon, helium, nitrogen, hydrogen, and combinations thereof. In an alternative embodiment, the oxygen-containing source does not comprise an inert gas. In yet another embodiment, the oxygen-containing source comprises nitrogen which reacts with the reagents under plasma conditions to provide a silicon oxynitride film.

In one or more embodiments described above, the oxygen-containing plasma source is selected from the group consisting of oxygen plasma with or without inert gas, water vapor plasma with or without inert gas, nitrogen oxides ($N_2O$, NO, $NO_2$) plasma with or without inert gas, carbon oxides ($CO_2$, CO) plasma with or without inert gas, and combinations thereof. In certain embodiments, the oxygen-containing plasma source further comprises an inert gas. In these embodiments, the inert gas is selected from the group consisting of argon, helium, nitrogen, hydrogen, or combinations thereof. In an alternative embodiment, the oxygen-containing plasma source does not comprise an inert gas.

One embodiment of the invention relates to a composition for depositing a film selected from a silicon oxide or a carbon doped silicon oxide film using a vapor deposition process, the composition comprising: at least one silicon precursor comprising a compound having the following Formulae A and B:

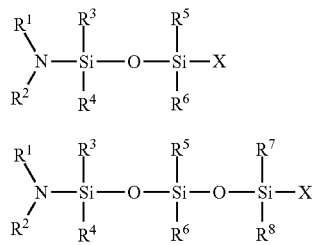

wherein $R^1$ is independently selected from a linear $C_1$ to $C_{10}$ alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group; $R^2$ is selected from the group consisting of hydrogen, a $C_1$ to $C_{10}$ linear alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group, wherein $R^1$ and $R^2$ in Formula A or B are either linked to form a cyclic ring structure or are not linked to form a cyclic ring structure; $R^{3-9}$ are each independently selected from hydrogen, a linear $C_1$ to $C_{10}$ alkyl group, a branched $C_3$ to $C_{10}$ alkyl group, a $C_3$ to $C_{10}$ cyclic alkyl group, a $C_2$ to $C_{10}$ alkenyl group, a $C_2$ to $C_{10}$ alkynyl group, and a $C_4$ to $C_{10}$ aryl group; X is selected from the group consisting of hydrogen, a linear $C_1$ to $C_{10}$ alkyl group, a branched $C_3$ to $C_{10}$ alkyl group, a $C_3$ to $C_{10}$ cyclic alkyl group, a $C_2$ to $C_{10}$ alkenyl group, a $C_2$ to $C_{10}$ alkynyl group, a $C_4$ to $C_{10}$ aryl group, halide (Cl, Br, I), and $NR^9R^{10}$ where $R^9$ and $R^{10}$ are each independently selected from hydrogen, a $C_1$ to $C_6$ linear alkyl group, a branched $C_3$ to $C_6$ alkyl group, a $C_3$ to $C_{10}$ cyclic alkyl group, a $C_3$ to $C_{10}$ alkenyl group, a $C_3$ to $C_{10}$ alkynyl group, and a $C_4$ to $C_{10}$ aryl group, wherein $R^9$ and $R^{10}$ are either linked to form a cyclic ring structure or are not linked to form a cyclic ring structure, and wherein $R^1$ and $R^9$ are either linked to form a cyclic ring or are not linked to form a cyclic ring.

Another embodiment of the invention relates to a silicon oxide film comprising at least one of the following characteristics a density of at least about 2.1 g/cc; a wet etch rate that is less than about 2.5 Å/s as measured in a solution of 1:100 of HF to water dilute HF (0.5 wt % dHF) acid; an electrical leakage of less than about 1 e-8 A/cm² up to 6 MV/cm; and a hydrogen impurity of less than about 5 e20 at/cc as measured by SIMS.

The embodiments of the invention can be used alone or in combinations with each other.

DETAILED DESCRIPTION OF THE INVENTION

Described herein are compositions and methods related to the formation of a stoichiometric or nonstoichiometric film or material comprising silicon and oxide such as, without limitation, a silicon oxide, a carbon-doped silicon oxide film, a silicon oxynitride, a carbon-doped silicon oxynitride films or combinations thereof with one or more temperatures, of about 300° C. or less, or from about 25° C. to about 300° C., or from about 250° C. to about 600° C. or from 600 to about 800° C. The films described herein are deposited in a deposition process such as an atomic layer deposition (ALD) or in an ALD-like process such as, without limitation, a plasma enhanced ALD or a plasma enhanced cyclic chemical vapor deposition process (CCVD). The low temperature deposition (e.g., one or more deposition temperatures ranging from about ambient temperature to 300° C.) methods described herein provide films or materials that exhibit at least one or more of the following advantages: a density of about 2.1 g/cc or greater, a growth rate of 1.0 Å/cycle or greater, low chemical impurity, high conformality in a thermal atomic layer deposition, a plasma enhanced atomic layer deposition (ALD) process or a plasma enhanced ALD-like process, an ability to adjust carbon content in the resulting film; and/or films have an etching rate of 5 Angstroms per second (Å/sec) or less when measured in 0.5 wt % dilute HF. For carbon-doped silicon oxide films, greater than 1% carbon is desired to tune the etch rate to values below 2 Å/sec in 0.5 wt % dilute HF in addition to other characteristics such as, without limitation, a density of about 1.8 g/cc or greater or about 2.0 g/cc or greater.

The instant invention can be practiced using equipment known in the art. For example, the inventive method can use a reactor that is conventional in the semiconductor manufacturing art.

In one aspect, there is provided a composition comprising at least one silicon precursor compound having at least one Si—O—Si linkage and at least one organoamino functionality. Such silicon precursors compound has a structure that is represented by either Formulae A and/or B:

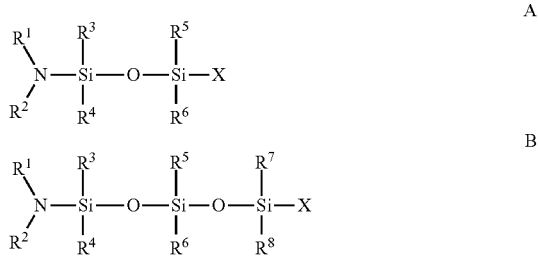

wherein $R^1$ is independently selected from a linear $C_1$ to $C_{10}$ alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group; $R^2$ is selected from the group consisting of hydrogen, a $C_1$ to $C_{10}$ linear alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group, wherein $R^1$ and $R^2$ in Formula A or B are either linked to form a cyclic ring structure or are not linked to form a cyclic ring structure; $R^{3-8}$ are each independently selected from hydrogen, a linear $C_1$ to $C_{10}$ alkyl group, a branched $C_3$ to $C_{10}$ alkyl group, a $C_3$ to $C_{10}$ cyclic alkyl group, a $C_2$ to $C_{10}$ alkenyl group, a $C_2$ to $C_{10}$ alkynyl group, and a $C_4$ to $C_{10}$ aryl group; X is selected from the group consisting of hydrogen, a linear $C_1$ to $C_{10}$ alkyl group, a branched $C_3$ to $C_{10}$ alkyl group, a $C_3$ to $C_{10}$ cyclic alkyl group, a $C_2$ to $C_{10}$ alkenyl group, a $C_2$ to $C_{10}$ alkynyl group, a $C_4$ to $C_{10}$ aryl group, halide (Cl, Br, I), and $NR^9R^{10}$ where $R^9$ and $R^{10}$ are each independently selected from hydrogen, a $C_1$ to $C_6$ linear alkyl group, a branched $C_3$ to $C_6$ alkyl group, a $C_3$ to $C_{10}$ cyclic alkyl group, a $C_3$ to $C_{10}$ alkenyl group, a $C_3$ to $C_{10}$ alkynyl group, and a $C_4$ to $C_{10}$ aryl group, wherein $R^9$ and $R^{10}$ are either linked to form a cyclic ring structure or are not linked to form a cyclic ring structure, and wherein $R^1$ and $R^9$ are either linked to form a cyclic ring or are not linked to form a cyclic ring;

In another aspect, there is provided a composition comprising: (a) at least one silicon precursor compound having at least one Si—O—Si linkage and at least one organoamino functionality. Such silicon precursors compound has a structure that is represented by either Formulae A or B:

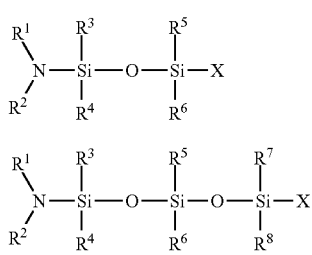

wherein $R^1$ is independently selected from a linear $C_1$ to $C_{10}$ alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group; $R^2$ is selected from the group consisting of hydrogen, a $C_1$ to $C_{10}$ linear alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group, wherein $R^1$ and $R^2$ in Formula A or B are either linked to form a cyclic ring structure or are not linked to form a cyclic ring structure; $R^{3-8}$ are each independently selected from hydrogen, a linear $C_1$ to $C_{10}$ alkyl group, a branched $C_3$ to $C_{10}$ alkyl group, a $C_3$ to $C_{10}$ cyclic alkyl group, a $C_2$ to $C_{10}$ alkenyl group, a $C_2$ to $C_{10}$ alkynyl group, and a $C_4$ to $C_{10}$ aryl group; X is selected from the group consisting of hydrogen, a linear $C_1$ to $C_{10}$ alkyl group, a branched $C_3$ to $C_{10}$ alkyl group, a $C_3$ to $C_{10}$ cyclic alkyl group, a $C_2$ to $C_{10}$ alkenyl group, a $C_2$ to $C_{10}$ alkynyl group, a $C_4$ to $C_{10}$ aryl group, halide (Cl, Br, I), and $NR^9R^{10}$ where $R^9$ and $R^{10}$ are each independently selected from hydrogen, a $C_1$ to $C_6$ linear alkyl group, a branched $C_3$ to $C_6$ alkyl group, a $C_3$ to $C_{10}$ cyclic alkyl group, a $C_3$ to $C_{10}$ alkenyl group, a $C_3$ to $C_{10}$ alkynyl group, and a $C_4$ to $C_{10}$ aryl group, wherein $R^9$ and $R^{10}$ are either linked to form a cyclic ring structure or are not linked to form a cyclic ring structure, and wherein $R^1$ and $R^9$ are either linked to form a cyclic ring or are not linked to form a cyclic ring; and (b) a solvent. In certain embodiments of the composition described herein, exemplary solvents can include, without limitation, ether, tertiary amine, alkyl hydrocarbon, aromatic hydrocarbon, tertiary aminoether, and combinations thereof. In certain embodiments, the difference between the boiling point of the silicon precursor and the boiling point of the solvent is 40° C. or less.

In one embodiment of the method described herein, the method is conducted via an ALD process that uses an oxygen-containing source which comprises ozone or a plasma wherein the plasma can further comprise an inert gas such as one or more of the following: an oxygen plasma with or without inert gas, a water vapor plasma with or without inert gas, a nitrogen oxide (e.g., $N_2O$, NO, $NO_2$) plasma with or without inert gas, a carbon oxide (e.g., $CO_2$, CO) plasma with or without inert gas, and combinations thereof. In this embodiment, the method for depositing a silicon oxide film on at least one surface of a substrate comprises the following steps:

a) providing a substrate in a reactor;
b) introducing into the reactor at least one silicon precursor having Formulae A or B described herein;
c) purging the reactor with purge gas;
d) introducing oxygen-containing source comprising a plasma into the reactor; and
e) purging the reactor with a purge gas.

In the method described above, steps b through e are repeated until a desired thickness of film is deposited on the substrate. The oxygen-containing plasma source can be generated in situ or, alternatively, remotely. In one particular embodiment, the oxygen-containing source comprises oxygen and is flowing, or introduced during method steps b through d, along with other reagents such as without limitation, the at least one silicon precursor and optionally an inert gas.

In another aspect, there is provided a method for depositing a silicon-containing film, the method comprising:

placing a substrate comprising a surface feature into a reactor wherein the substrate is maintained at one or more temperatures ranging from about −20° C. to about 400° C. and a pressure of the reactor is maintained at 100 torr or less;

introducing at least one silicon precursor having Formulae A or B described herein;

providing an oxygen-containing source into the reactor to react with the at least one compound to form a film and cover at least a portion of the surface feature;

annealing the film at one or more temperatures of about 100° C. to 1000° C. to coat at least a portion of the surface feature; and treating the substrate with an oxygen-containing source at one or more temperatures ranging from about 20° C. to about 1000° C. to form a silicon-containing film on at least a portion of the surface feature. In certain embodiments, the oxygen-containing source is selected from the group consisting of water vapors, water plasma, ozone, oxygen, oxygen plasma, oxygen/helium plasma, oxygen/argon plasma, nitrogen oxides plasma, carbon dioxide plasma, hydrogen peroxide, organic peroxides, and mixtures thereof. In this or other embodiments, the method steps are repeated until the surface features are filled with the silicon-containing film. In embodiments wherein water vapor is employed as an oxygen-containing source, the substrate temperature ranges from about −20° C. to about 40° C. or from about −10° C. to about 25° C.

In another embodiment of the method described herein, the method is conducted via an ALD process that uses an oxygen-containing source which comprises ozone or a plasma wherein the plasma can further comprise an inert gas such as one or more of the following: an oxygen plasma with or without inert gas, a water vapor plasma with or without inert gas, a nitrogen oxide (e.g., $N_2O$, NO, $NO_2$) plasma with or without inert gas, a carbon oxide (e.g., $CO_2$, CO) plasma with or without inert gas, and combinations thereof. In this embodiment, the method for depositing a silicon oxide film on at least one surface of a substrate at temperatures below 300° C., preferably below 150° C. comprises the following steps:

a) providing a substrate in a reactor;
b) introducing into the reactor at least one silicon precursor having Formulae A or B wherein $R^3$ and $R^4$ are both hydrogen;
c) purging the reactor with purge gas;
d) introducing oxygen-containing source comprising a plasma into the reactor; and
e) purging the reactor with a purge gas.

In the method described above, steps b through e are repeated until a desired thickness of film is deposited on the substrate. The oxygen-containing plasma source can be generated in situ or, alternatively, remotely. In one particular embodiment, the oxygen-containing source comprises oxygen and is flowing, or introduced during method steps b through d, along with other reagents such as without limitation, the at least one silicon precursor and optionally an inert gas.

Yet, in another embodiment of the method described herein, the method is conducted via an ALD process that uses an oxygen-containing source which comprises ozone or a plasma wherein the plasma can further comprise an inert gas such as one or more of the following: an oxygen plasma with or without inert gas, a water vapor plasma with or without inert gas, a nitrogen oxide (e.g., $N_2O$, NO, $NO_2$) plasma with or without inert gas, a carbon oxide (e.g., $CO_2$, CO) plasma with or without inert gas, and combinations thereof. In this embodiment, the method for depositing a silicon oxide film on at least one surface of a substrate at temperatures above 600° C. comprises the following steps:

a) providing a substrate in a reactor;
b) introducing into the reactor at least one silicon precursor having Formulae A or B wherein $R^{3-8}$ and X are all methyl groups;
c) purging the reactor with purge gas;
d) introducing oxygen-containing source comprising a plasma into the reactor; and
e) purging the reactor with a purge gas.

In the method described above, steps b through e are repeated until a desired thickness of film is deposited on the substrate. The oxygen-containing plasma source can be generated in situ or, alternatively, remotely. In one particular embodiment, the oxygen-containing source comprises oxygen and is flowing, or introduced during method steps b through d, along with other reagents such as without limitation, the at least one silicon precursor and optionally an inert gas.

In one or more embodiments, the at least one silicon precursor comprises an organoaminodisiloxane compound having the Formula A described above. In one particular embodiment, $R^{3-6}$ in the formula comprise a hydrogen or $C_1$ alkyl group or methyl. Further exemplary precursors are listed in Table 1

TABLE 1

Organoaminodisiloxane Compounds Having one Si—O—Si linkage in Formula A.

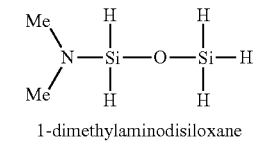

1-dimethylaminodisiloxane

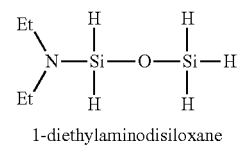

1-diethylaminodisiloxane

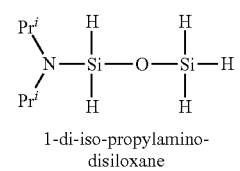

1-di-iso-propylamino-disiloxane

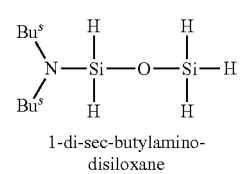

1-di-sec-butylamino-disiloxane

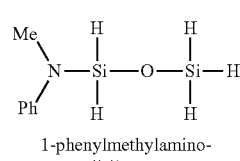

1-phenylmethylamino-disiloxane

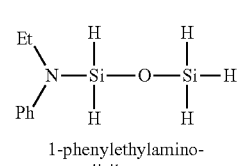

1-phenylethylamino-disiloxane

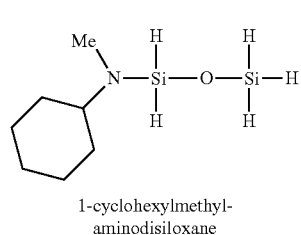 [SMILES: CN([SiH2]O[SiH3])C1CCCCC1]

1-cyclohexylmethyl-aminodisiloxane

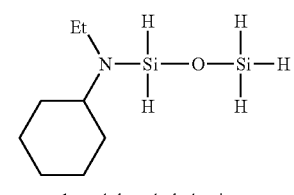

1-cyclohexylethylamino-disiloxane

TABLE 1-continued

Organoaminodisiloxane Compounds Having one Si—O—Si linkage in Formula A.

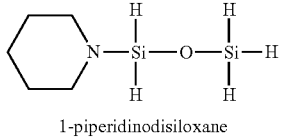

1-piperidinodisiloxane

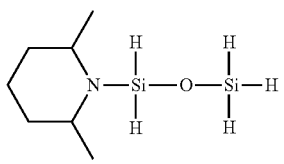

1-(2,6-dimethylpiperidino)disiloxane

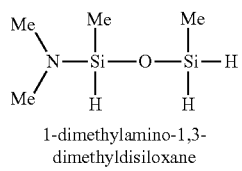

1-dimethylamino-1,3-dimethyldisiloxane

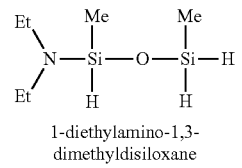

1-diethylamino-1,3-dimethyldisiloxane

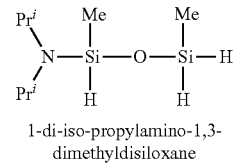

1-di-iso-propylamino-1,3-dimethyldisiloxane

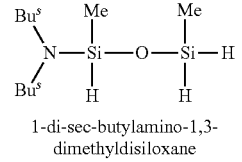

1-di-sec-butylamino-1,3-dimethyldisiloxane

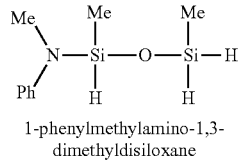

1-phenylmethylamino-1,3-dimethyldisiloxane

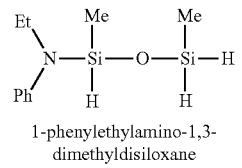

1-phenylethylamino-1,3-dimethyldisiloxane

TABLE 1-continued

Organoaminodisiloxane Compounds Having one Si—O—Si linkage in Formula A.

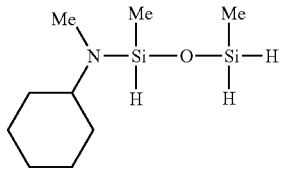

1-cyclohexylmethylamino-1,3-dimethyldisiloxane

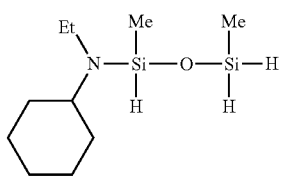

1-cyclohexylethylamino-1,3-dimethyldisiloxane

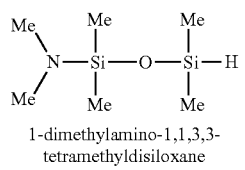

1-dimethylamino-1,1,3,3-tetramethyldisiloxane

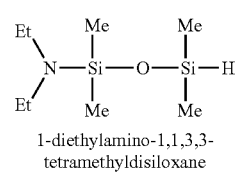

1-diethylamino-1,1,3,3-tetramethyldisiloxane

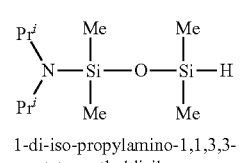

1-di-iso-propylamino-1,1,3,3-tetramethyldisiloxane

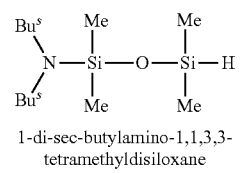

1-di-sec-butylamino-1,1,3,3-tetramethyldisiloxane

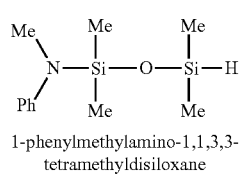 [SMILES: CN(c1ccccc1)[Si](C)(C)O[SiH](C)C]

1-phenylmethylamino-1,1,3,3-tetramethyldisiloxane

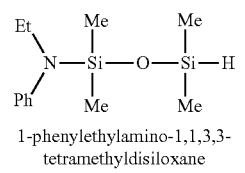

1-phenylethylamino-1,1,3,3-tetramethyldisiloxane

TABLE 1-continued

Organoaminodisiloxane Compounds Having one Si—O—Si linkage in Formula A.

1-dimethylamino-1,1,3,3,3-pentamethyldisiloxane 1-diethylamino-1,1,3,3,3-pentamethyldisiloxane 1-di-iso-propylamino-1,1,3,3,3-pentamethyldisiloxane 1-di-sec-butylamino-1,1,3,3,3-pentamethyldisiloxane 1-pyrrolyl-1,1,3,3,3-pentamethyldisiloxane 1-pyrrolidino-1,1,3,3,3-pentamethyldisiloxane 1-piperidino-1,1,3,3,3-pentamethyldisiloxane 1-(2,6-dimethylpiperidino)-3,3,3-pentamethyldisiloxane TABLE 1-continued Organoaminodisiloxane Compounds Having one Si—O—Si linkage in Formula A.

1-iso-propylamino-3,3,3-trimethyldisiloxane 1-tert-butylamino-3,3,3-trimethyldisiloxane 1-dimethylamino-3,3,3-trimethyldisiloxane 1-diethylamino-3,3,3-trimethyldisiloxane 1-di-iso-propylamino-3,3,3-trimethyldisiloxane 1-di-sec-butylamino-3,3,3-trimethyldisiloxane 1-cyclohexylmethylamino-3,3,3-trimethyldisiloxane 1-cyclohexylethylamino-3,3,3-trimethyldisiloxane TABLE 1-continued Organoaminodisiloxane Compounds Having one Si—O—Si linkage in Formula A.

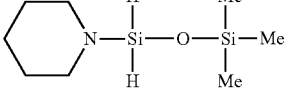

1-piperidino-3,3,3-
trimethyldisiloxane

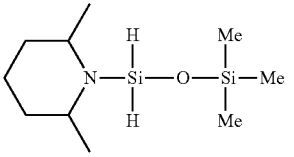

1-(2,6-dimethylpiperidino)-3,3,3-
trimethyldisiloxane

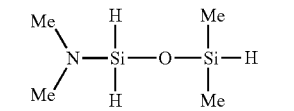

1-dimethylamino-3,3-
dimethyldisiloxane

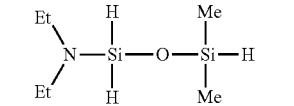

1-diethylamino-3,3-
dimethyldisiloxane

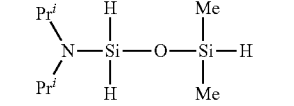

1-di-iso-propylamino-3,3-
dimethyldisiloxane

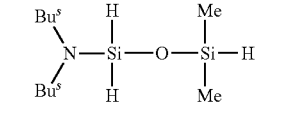

1-di-sec-butylamino-3,3-
dimethyldisiloxane

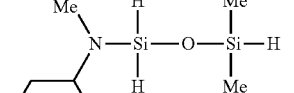

1-cyclohexylmethylamino-3,3-
dimethyldisiloxane

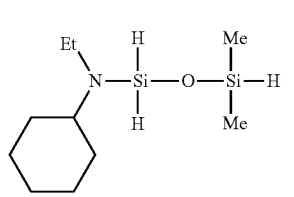

1-cyclohexylethylamino-3,3-
dimethyldisiloxane

TABLE 1-continued

Organoaminodisiloxane Compounds Having one Si—O—Si linkage in Formula A.

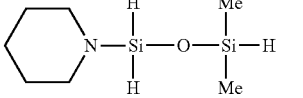

1-piperidino-3,3-
dimethyldisiloxane

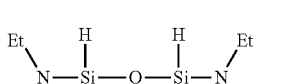

1-(2,6-dimethylpiperidino)-3,3-
dimethyldisiloxane

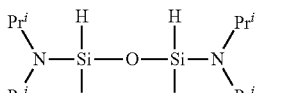

1,3-bis(dimethylamino)
disiloxane

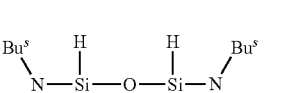

1,3-bis(diethylamino)
disiloxane

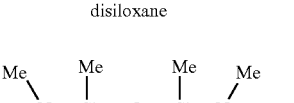

1,3-bis(di-iso-propylamino)
disiloxane

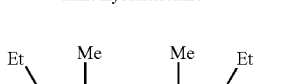

1,3-bis(di-sec-butylamino)
disiloxane

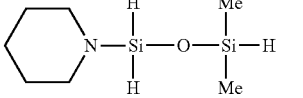

1,3-bis(dimethylamino)-1,3-
dimethyldisiloxane

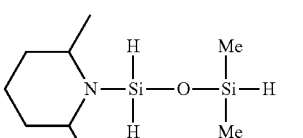

1,3-bis(diethylamino)-1,3-
dimethyldisiloxane

TABLE 1-continued

Organoaminodisiloxane Compounds Having one Si—O—Si linkage in Formula A.

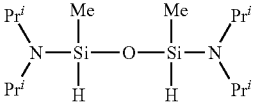

1,3-bis(di-iso-propylamino)-1,3-dimethyldisiloxane

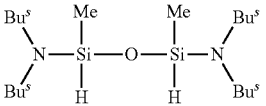

1,3-bis(di-sec-butylamino)-1,3-dimethyldisiloxane

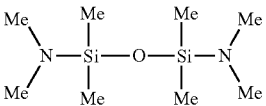

1,3-bis(dimethylamino)-1,1,3,3-tetramethyldisiloxane

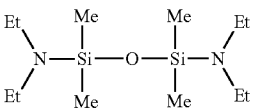

1,3-bis(diethylamino)-1,1,3,3-tetramethyldisiloxane

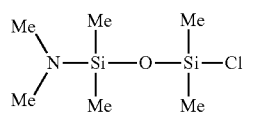

1-dimethylamino-1,1,3,3-tetramethyl-3-chlorodisiloxane

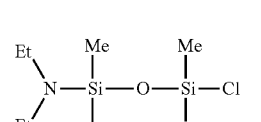

1-diethylamino-1,1,3,3-tetramethyl-3-chlorodisiloxane

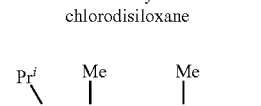

1-di-iso-propylamino-1,1,3,3-tetramethyl-3-chlorodisiloxane

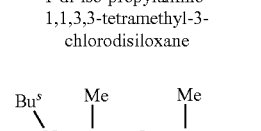

1-di-sec-butylamino-1,1,3,3-tetramethyl-3-chlorodisiloxane

TABLE 1-continued

Organoaminodisiloxane Compounds Having one Si—O—Si linkage in Formula A.

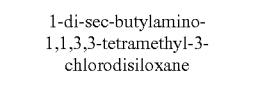

1-dimethylamino-1,1,3,3-tetramethyl-3-bromodisiloxane

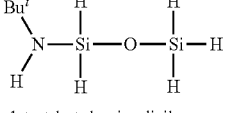

1-diethylamino-1,1,3,3-tetramethyl-3-bromodisiloxane

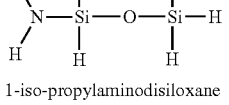

1-di-iso-propylamino-1,1,3,3-tetramethyl-3-bromodisiloxane

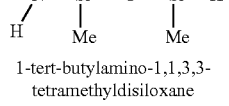

1-di-sec-butylamino-1,1,3,3-tetramethyl-3-bromodisiloxane

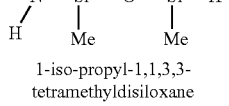

1-tert-butylaminodisiloxane

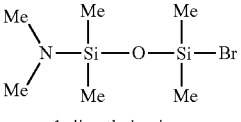

1-iso-propylaminodisiloxane

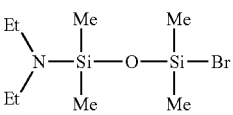

1-tert-butylamino-1,1,3,3-tetramethyldisiloxane

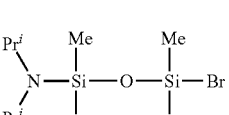

1-iso-propyl-1,1,3,3-tetramethyldisiloxane

In one or more embodiments, the at least one silicon precursor comprises an organoaminotrisiloxane compound having the Formula B described herein. In one particular embodiment, $R^{3-8}$ in the formula comprise a hydrogen or $C_1$ alkyl group or methyl. Further exemplary precursors are listed in Table 2:

TABLE 2

Organoaminotrisiloxane Compounds Having Two Si—O—Si linkages in Formula B.

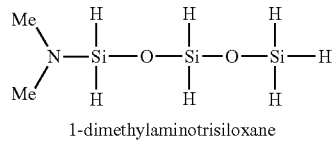
1-dimethylaminotrisiloxane

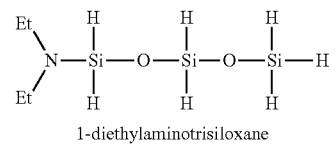
1-diethylaminotrisiloxane

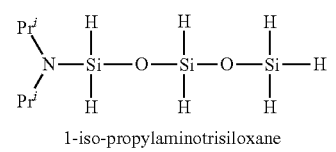
1-iso-propylaminotrisiloxane

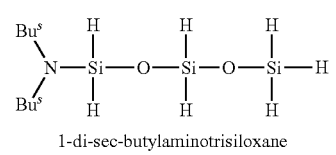
1-di-sec-butylaminotrisiloxane

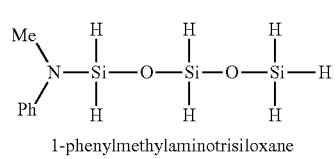 [SMILES: CN([SiH2]O[SiH2]O[SiH3])c1ccccc1]
1-phenylmethylaminotrisiloxane

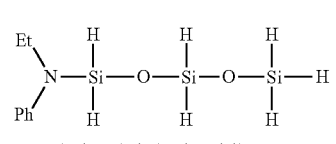
1-phenylethylaminotrisiloxane

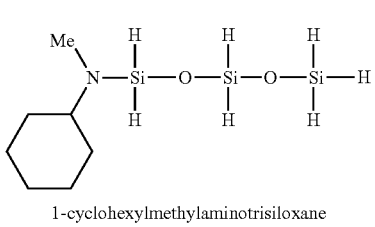 [SMILES: CN([SiH2]O[SiH2]O[SiH3])C1CCCCC1]
1-cyclohexylmethylaminotrisiloxane

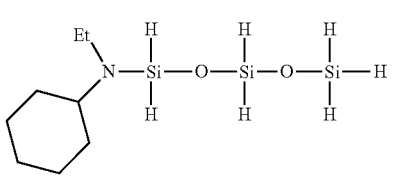
1-cyclohexylethylaminotrisiloxane

TABLE 2-continued

Organoaminotrisiloxane Compounds Having Two Si—O—Si linkages in Formula B.

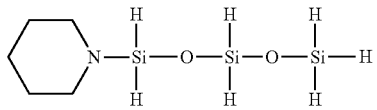
1-piperidinotrisiloxane

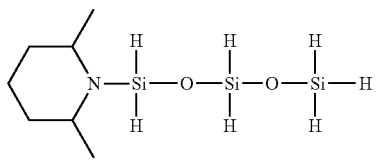
1-(2,6-dimethylpiperidino)trisiloxane

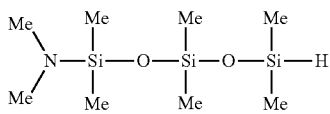
1-dimethylamino-1,1,3,3,5,5-hexamethyltrisiloxane

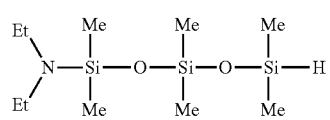
1-diethylamino-1,1,3,3,5,5-hexamethyltrisiloxane

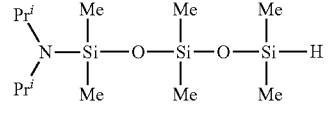
1-di-iso-propylamino-1,1,3,3,5,5-hexamethyltrisiloxane

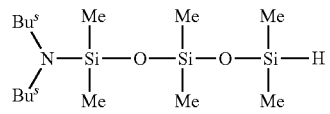
1-sec-butylamino-1,1,3,3,5,5-hexamethyltrisiloxane

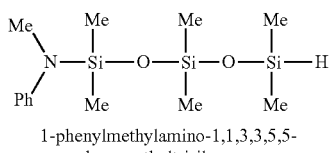
1-phenylmethylamino-1,1,3,3,5,5-hexamethyltrisiloxane

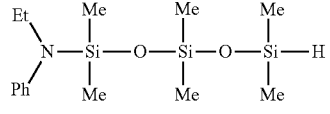
1-phenylethylamino-1,1,3,3,5,5-hexamethyltrisiloxane

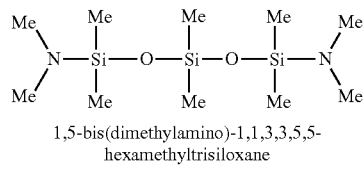 [SMILES: CN(C)[Si](C)(C)O[Si](C)(C)O[Si](C)(C)N(C)C]
1,5-bis(dimethylamino)-1,1,3,3,5,5-hexamethyltrisiloxane

TABLE 2-continued

Organoaminotrisiloxane Compounds Having
Two Si—O—Si linkages in Formula B.

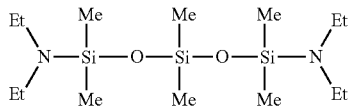

1,5-bis(diethylamino)-1,1,3,3,5,5-
hexamethyltrisiloxane

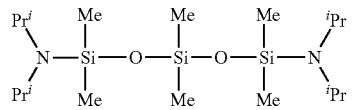

1,5-bis(di-iso-propylamino)-1,1,3,3,5,5-
hexamethyltrisiloxane

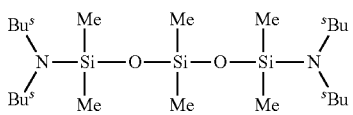

1,5-bis(sec-butylamino)-1,1,3,3,5,5-
hexamethyltrisiloxane

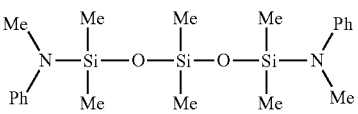

1,5-bis(phenylmethylamino)-1,1,3,3,5,5-
hexamethyltrisiloxane

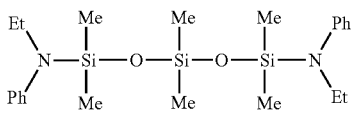

1,5-bis(phenylethylamino)-1,1,3,3,5,5-
hexamethyltrisiloxane

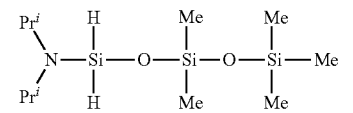

1-di-iso-propylamino-3,3,5,5,5-
pentamethyltrisiloxane

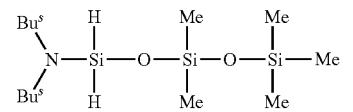

1-sec-butylamino-3,3,5,5,5-
pentamethyltrisiloxane

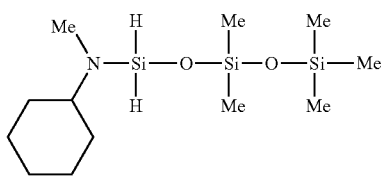

1-cyclohexylmethylamino-3,3,5,5,5-
pentamethyltrisiloxane

TABLE 2-continued

Organoaminotrisiloxane Compounds Having
Two Si—O—Si linkages in Formula B.

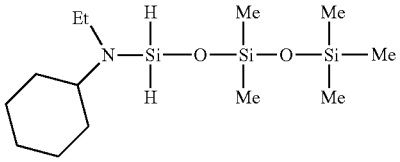

1-cyclohexylethylamino-3,3,5,5,5-
pentamethyltrisiloxane

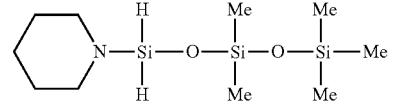

1-piperidino-3,3,5,5,5-
pentamethyltrisiloxane

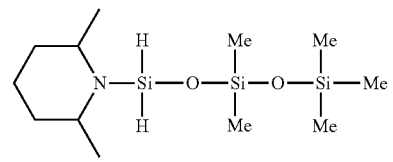

1-(2,6-dimethylpiperidino)-3,3,5,5,5-
pentamethyltrisiloxane

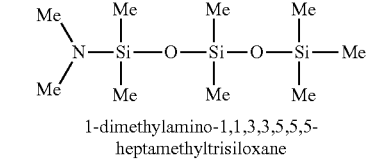 [SMILES: CN(C)[Si](C)(C)O[Si](C)(C)O[Si](C)(C)C]

1-dimethylamino-1,1,3,3,5,5,5-
heptamethyltrisiloxane

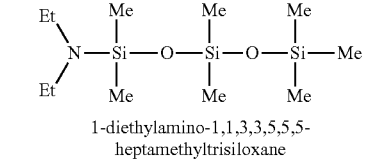 [SMILES: CCN(CC)[Si](C)(C)O[Si](C)(C)O[Si](C)(C)C]

1-diethylamino-1,1,3,3,5,5,5-
heptamethyltrisiloxane

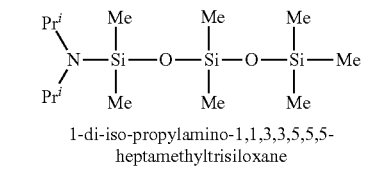

1-di-iso-propylamino-1,1,3,3,5,5,5-
heptamethyltrisiloxane

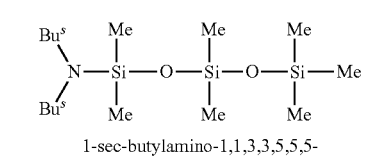

1-sec-butylamino-1,1,3,3,5,5,5-
heptamethyltrisiloxane

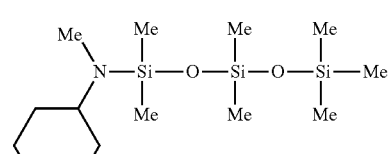

1-cyclohexylmethylamino-1,1,3,3,5,5,5-
heptamethyltrisiloxane

TABLE 2-continued

Organoaminotrisiloxane Compounds Having
Two Si—O—Si linkages in Formula B.

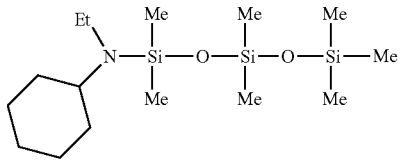

1-cyclohexylethylamino-1,1,3,3,5,5,5-
heptamethyltrisiloxane

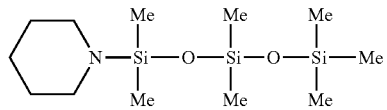

1-piperidino-1,1,3,3,5,5,5-
heptamethyltrisiloxane

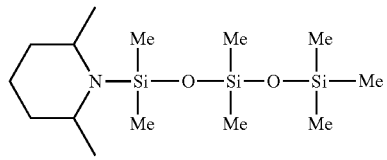

1-(2,6-dimethylpiperidino)-1,1,3,3,5,5,5-
heptamethyltrisiloxane

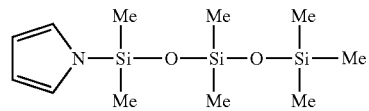

1-pyrrolyl-1,1,3,3,5,5,5-
heptamethyltrisiloxane

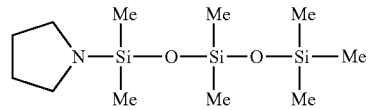

1-pyrrolidino-1,1,3,3,5,5,5-
heptamethyltrisiloxane

In the formulas above and throughout the description, the term "alkyl" denotes a linear or branched functional group having from 1 to 10 carbon atoms. Exemplary linear alkyl groups include, but are not limited to, methyl, ethyl, propyl, butyl, pentyl, and hexyl groups. Exemplary branched alkyl groups include, but are not limited to, iso-propyl, iso-butyl, sec-butyl, tert-butyl, iso-pentyl, tert-pentyl, iso-hexyl, and neo-hexyl. In certain embodiments, the alkyl group may have one or more functional groups attached thereto such as, but not limited to, an alkoxy group, a dialkylamino group or combinations thereof, attached thereto. In other embodiments, the alkyl group does not have one or more functional groups attached thereto. The alkyl group may be saturated or, alternatively, unsaturated.

In the formulas above and throughout the description, the term "cyclic alkyl" denotes a cyclic functional group having from 3 to 10 carbon atoms. Exemplary cyclic alkyl groups include, but are not limited to, cyclobutyl, cyclopentyl, cyclohexyl, and cyclooctyl groups.

In the formulas above and throughout the description, the term "alkenyl group" denotes a group which has one or more carbon-carbon double bonds and has from 2 to 10 or from 2 to 10 or from 2 to 6 carbon atoms.

In the formulas above and throughout the description, the term "alkynyl group" denotes a group which has one or more carbon-carbon triple bonds and has from 3 to 10 or from 2 to 10 or from 2 to 6 carbon atoms.

In the formulas above and throughout the description, the term "aryl" denotes an aromatic cyclic functional group having from 4 to 10 carbon atoms, from 5 to 10 carbon atoms, or from 6 to 10 carbon atoms. Exemplary aryl groups include, but are not limited to, phenyl, benzyl, chlorobenzyl, tolyl, o-xylyl, 1,2,3-triazolyl, pyrrrolyl, and furanyl.

In the formulas above and throughout the description, the term "amino" denotes an organoamino group having from 1 to 10 carbon atoms derived from an organoamine with formula of $HNR^1R^2$. Exemplary amino groups include, but are not limited to, secondary amino groups derived from secondary amines such as dimethylamino ($Me_2N-$), diethyamino ($Et_2N-$), di-iso-propylamino ($^iPr_2N-$); primary amino groups derived from primary amines such as methylamino (MeNH—), ethylamine (EtNH—), iso-propylamino ($^iPrNH-$), sec-butylamino ($^sBuNH-$), and tert-butylamino ($^tBuNH-$).

The inventive compounds having Formulae A or B can be produced, for example, by following one or more of the reactions shown in equations (1) to (10):

(1)
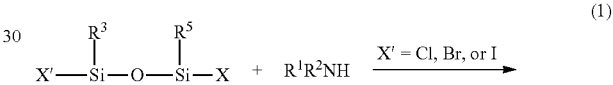

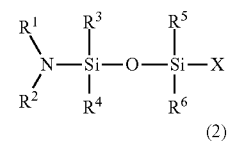

(2)
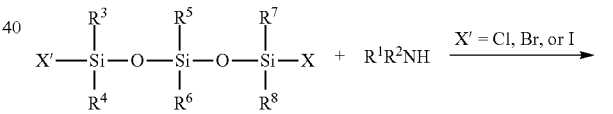

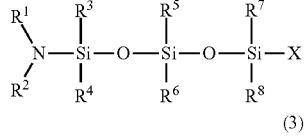

(3)
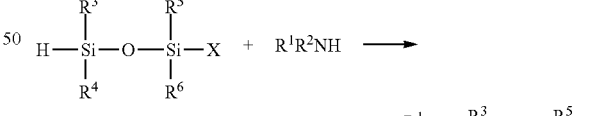

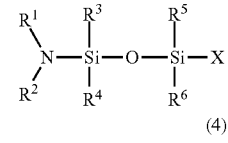

(4)
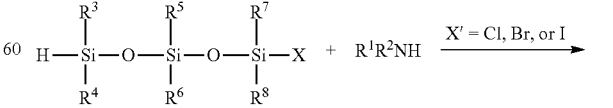

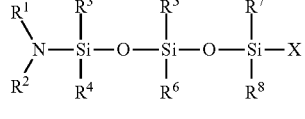

-continued

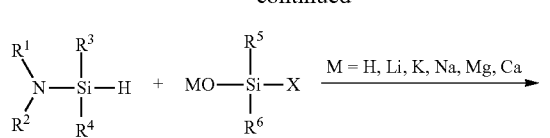
(5)

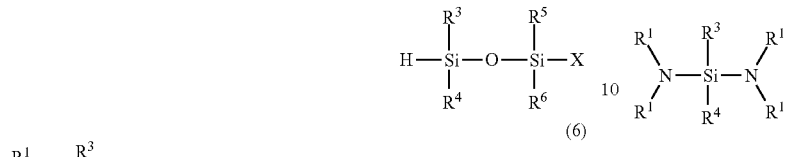
(6)

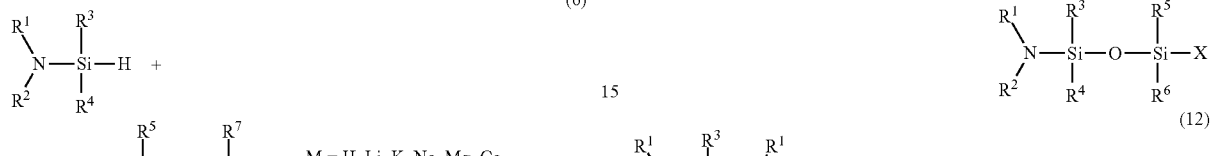
(7)

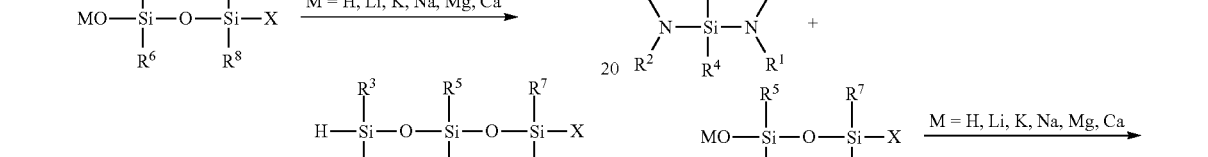
(8)

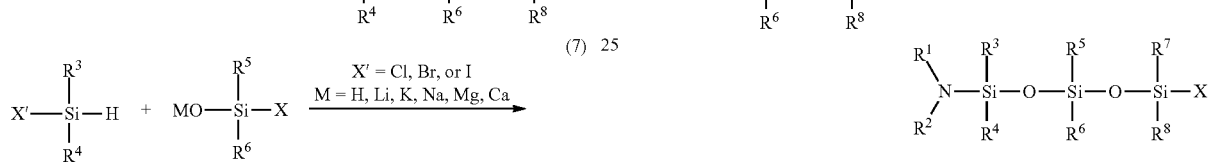
(9)

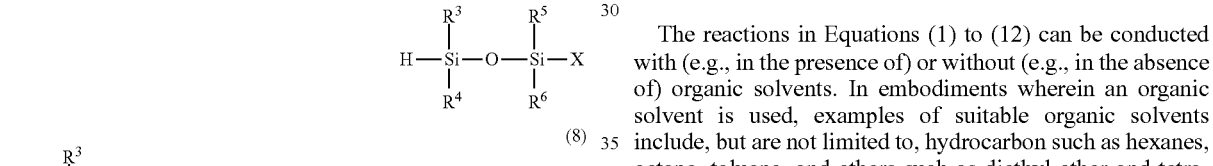
(10)

-continued

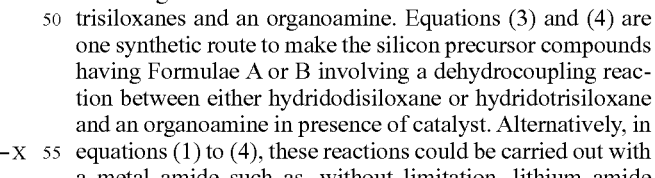
(11)

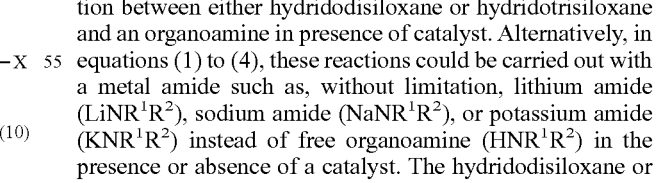
(12)

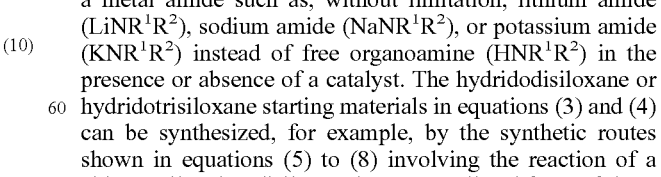

The reactions in Equations (1) to (12) can be conducted with (e.g., in the presence of) or without (e.g., in the absence of) organic solvents. In embodiments wherein an organic solvent is used, examples of suitable organic solvents include, but are not limited to, hydrocarbon such as hexanes, octane, toluene, and ethers such as diethyl ether and tetrahydrofuran (THF). In these or other embodiments, the reaction temperature is in the range of from about −70° C. to the boiling point of the solvent employed if a solvent is used or to the boiling point of the most volatile component in the reaction. In other embodiments, the reaction temperature can be higher than the normal boiling point of the most volatile component if a high pressure reactor is used. The resulting silicon precursor compound can be purified, for example, via vacuum distillation after removing all by-products as well as any solvent(s) if present.

Equations (1) and (2) are one synthetic route to make the silicon precursor compounds having Formulae A or B involving a reaction between halidodisiloxanes or halidotrisiloxanes and an organoamine. Equations (3) and (4) are one synthetic route to make the silicon precursor compounds having Formulae A or B involving a dehydrocoupling reaction between either hydridodisiloxane or hydridotrisiloxane and an organoamine in presence of catalyst. Alternatively, in equations (1) to (4), these reactions could be carried out with a metal amide such as, without limitation, lithium amide (LiNR$^1$R$^2$), sodium amide (NaNR$^1$R$^2$), or potassium amide (KNR$^1$R$^2$) instead of free organoamine (HNR$^1$R$^2$) in the presence or absence of a catalyst. The hydridodisiloxane or hydridotrisiloxane starting materials in equations (3) and (4) can be synthesized, for example, by the synthetic routes shown in equations (5) to (8) involving the reaction of a either a silanol, a disiloxanol, or a metallated form of these two (e.g. potassium trimethylsilanolate, potassium pentamethyldisiloxanolate) with either an organoaminosilane or a halidosilane containing at least one Si—H bond. Equations (9) and (10) are another synthetic route to make the silicon precursor compounds having Formulae A or B involving the reaction of either a silanol, a disiloxanol, or a metallated form of these two with an organoaminohalidosilane. Equations (11) and (12) are yet another synthetic route to make the silicon precursor compounds having Formulae A or B involving the reaction of either a silanol, a disiloxanol, or a metallated form of these two with a bis(organoamino)silane. Other synthetic routes may be also employed to make these silicon precursor compounds having Formula A or B as disclosed in the prior art, for example reducing organoaminochlorodisiloxane or organoaminochlorotrisiloxane with metal hydride such as LiH, LiAlH$_4$ or reacting hydridodisiloxane or hydridotrisiloxane with imine in the presence or absence of catalyst (hydrosilylation of imine).

The silicon precursor compounds having Formulae A or B according to the present invention and compositions comprising the silicon precursor compounds having Formulae A or B according to the present invention are preferably substantially free of halide ions. As used herein, the term "substantially free" as it relates to halide ions (or halides) such as, for example, chlorides, fluorides, bromides, and iodides, means less than 5 ppm (by weight), preferably less than 3 ppm, and more preferably less than 1 ppm, and most preferably 0 ppm. Chlorides are known to act as decomposition catalysts for the silicon precursor compounds having Formulae A or B. Significant levels of chloride in the final product can cause the silicon precursor compounds to degrade. The gradual degradation of the silicon precursor compounds may directly impact the film deposition process making it difficult for the semiconductor manufacturer to meet film specifications. The silicon precursor compounds having Formulae A or B are preferably substantially free of metal ions such as, $Al^{3+}$ ions, $Fe^{2+}$, $Fe^{3+}$, $Ni^{2+}$, $Cr^{3+}$. As used herein, the term "substantially free" as it relates to $Al^{3+}$ ions, $Fe^{2+}$, $Fe^{3+}$, $Ni^{2+}$, $Cr^{3+}$ means less than 5 ppm (by weight), preferably less than 3 ppm, and more preferably less than 1 ppm, and most preferably 0.1 ppm. In some embodiments, the silicon precursor compounds having Formulae A or B are free of metal ions such as, $Al^{3+}$ ions, $Fe^{2+}$, $Fe^{3+}$, $Ni^{2+}$, $Cr^{3+}$. As used herein, the term "free of" as it relates to $Al^{3+}$ ions, $Fe^{2+}$, $Fe^{3+}$, $Ni^{2+}$, $Cr^{3+}$ means 0 ppm (by weight), In addition, the shelf-life or stability is negatively impacted by the higher degradation rate of the silicon precursor compounds thereby making it difficult to guarantee a 1-2 year shelf-life. Moreover, the silicon precursor compounds are known to form flammable and/or pyrophoric gases upon decomposition such as hydrogen and disiloxanes or trisiloxanes. Therefore, the accelerated decomposition of the silicon precursor compounds presents safety and performance concerns related to the formation of these flammable and/or pyrophoric gaseous byproducts.

For those embodiments wherein the silicon precursor(s) having Formulae A or B is (are) used in a composition comprising a solvent and a silicon precursor compounds having Formulae A or B described herein, the solvent or mixture thereof selected does not react with the silicon precursor. The amount of solvent by weight percentage in the composition ranges from 0.5 wt % by weight to 99.5 wt % or from 10 wt % by weight to 75 wt %. In this or other embodiments, the solvent has a boiling point (b.p.) similar to the b.p. of the silicon precursor of Formula A or B or the difference between the b.p. of the solvent and the b.p. of the silicon precuror of Formula A or B is 40° C. or less, 30° C. or less, or 20° C. or less, or 10° C. Alternatively, the difference between the boiling points ranges from any one or more of the following end-points: 0, 10, 20, 30, or 40° C. Examples of suitable ranges of b.p. difference include without limitation, 0 to 40° C., 20° C. to 30° C., or 10° C. to 30° C. Examples of suitable solvents in the compositions include, but are not limited to, an ether (such as 1,4-dioxane, dibutyl ether), a tertiary amine (such as pyridine, 1-methylpiperidine, 1-ethylpiperidine, N,N'-Dimethylpiperazine, N,N,N',N'-Tetramethylethylenediamine), a nitrile (such as benzonitrile), an alkyl hydrocarbon (such as octane, nonane, dodecane, ethylcyclohexane), an aromatic hydrocarbon (such as toluene, mesitylene), a tertiary aminoether (such as bis(2-dimethylaminoethyl) ether), or mixtures thereof.

Throughout the description, the term "ALD or ALD-like" refers to a process including, but not limited to, the following processes: a) each reactant including a silicon precursor and a reactive gas is introduced sequentially into a reactor such as a single wafer ALD reactor, semi-batch ALD reactor, or batch furnace ALD reactor; b) each reactant including the silicon precursor and the reactive gas is exposed to a substrate by moving or rotating the substrate to different sections of the reactor and each section is separated by inert gas curtain, i.e., spatial ALD reactor or roll to roll ALD reactor.

Throughout the description, the term "alkyl hydrocarbon" refers a linear or branched $C_1$ to $C_{20}$ hydrocarbon, cyclic $C_6$ to $C_{20}$ hydrocarbon. Exemplary hydrocarbon includes, but not limited to, heptane, octane, nonane, decane, dodecane, cyclooctane, cyclononane, cyclodecane. Throughout the description, the term "aromatic hydrocarbon" refers a $C_6$ to $C_{20}$ aromatic hydrocarbon. Exemplary aromatic hydrocarbon includes, but not limited to, toluene, mesitylene.

In certain embodiments, substituents $R^1$ and $R^2$ in the Formulas A and B can be linked together to form a ring structure. As the skilled person will understand, where $R^1$ and $R^2$ are linked together to form a ring and $R^1$ would include a bond for linking to $R^2$ and vice versa. In these embodiments, the ring structure can be unsaturated such as, for example, a cyclic alkyl ring, or saturated, for example, an aryl ring. Further, in these embodiments, the ring structure can also be substituted or unsubstituted with one or more atoms or groups. Exemplary cyclic ring groups include, but not limited to, pyrrolyl, pyrrolidino, piperidino, and 2,6-dimethylpiperidino groups. In other embodiments, however, substituent $R^1$ and $R^2$ are not linked to form a ring structure.

In certain embodiments, the silicon oxide or carbon doped silicon oxide films deposited using the methods described herein are formed in the presence of oxygen-containing source comprising ozone, water ($H_2O$) (e.g., deionized water, purifier water, and/or distilled water), oxygen ($C_2$), oxygen plasma, NO, $N_2O$, $NO_2$, carbon monoxide (CO), carbon dioxide ($CO_2$) and combinations thereof. The oxygen-containing source is passed through, for example, either an in situ or remote plasma generator to provide oxygen-containing plasma source comprising oxygen such as an oxygen plasma, a plasma comprising oxygen and argon, a plasma comprising oxygen and helium, an ozone plasma, a water plasma, a nitrous oxide plasma, or a carbon dioxide plasma. In certain embodiments, the oxygen-containing plasma source comprises an oxygen-containing source gas that is introduced into the reactor at a flow rate ranging from about 1 to about 2000 standard cubic centimeters (sccm) or from about 1 to about 1000 sccm. The oxygen-containing plasma source can be introduced for a time that ranges from about 0.1 to about 100 seconds. In one particular embodiment, the oxygen-containing plasma source comprises water having a temperature of 10° C. or greater. In embodiments wherein the film is deposited by a PEALD or a plasma enhanced cyclic CVD process, the precursor pulse can have a pulse duration that is greater than 0.01 seconds (e.g., about 0.01 to about 0.1 seconds, about 0.1 to about 0.5 seconds, about 0.5 to about 10 seconds, about 0.5 to about 20 seconds, about 1 to about 100 seconds) depending on the ALD reactor's volume, and the oxygen-containing plasma source can have a pulse duration that is less than 0.01 seconds (e.g., about 0.001 to about 0.01 seconds).

The deposition methods disclosed herein may involve one or more purge gases. The purge gas, which is used to purge away unconsumed reactants and/or reaction byproducts, is an inert gas that does not react with the precursors. Exemplary purge gases include, but are not limited to, argon (Ar), nitrogen ($N_2$), helium (He), neon, hydrogen ($H_2$), and mixtures thereof. In certain embodiments, a purge gas such as Ar is supplied into the reactor at a flow rate ranging from about 10 to about 2000 sccm for about 0.1 to 1000 seconds, thereby purging the unreacted material and any byproduct that may remain in the reactor.

The respective step of supplying the precursors, oxygen-containing source, and/or other precursors, source gases, and/or reagents may be performed by changing the time for supplying them to change the stoichiometric composition of the resulting dielectric film.

Energy is applied to the at least one of the silicon precursor, oxygen-containing source, or combination thereof to induce reaction and to form the dielectric film or coating on the substrate. Such energy can be provided by, but not limited to, thermal, plasma, pulsed plasma, helicon plasma, high density plasma, inductively coupled plasma, X-ray, e-beam, photon, remote plasma methods, and combinations thereof. In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively, a remote plasma-generated process in which plasma is generated outside of the reactor and supplied into the reactor.

The at least one silicon precursor may be delivered to the reaction chamber such as a plasma enhanced cyclic CVD or PEALD reactor or a batch furnace type reactor in a variety of ways. In one embodiment, a liquid delivery system may be utilized. In an alternative embodiment, a combined liquid delivery and flash vaporization process unit may be employed, such as, for example, the turbo vaporizer manufactured by MSP Corporation of Shoreview, Minn., to enable low volatility materials to be volumetrically delivered, which leads to reproducible transport and deposition without thermal decomposition of the precursor. In liquid delivery formulations, the precursors described herein may be delivered in neat liquid form, or alternatively, may be employed in solvent formulations or compositions comprising same. Thus, in certain embodiments the precursor formulations may include solvent component(s) of suitable character as may be desirable and advantageous in a given end use application to form a film on a substrate.

For those embodiments wherein the at least one silicon precursor described herein is used in a composition comprising a solvent and an at least one silicon precursor described herein, the solvent or mixture thereof selected does not react with the silicon precursor. The amount of solvent by weight percentage in the composition ranges from 0.5 wt % by weight to 99.5 wt % or from 10 wt % by weight to 75 wt %. In this or other embodiments, the solvent has a boiling point (b.p.) similar to the b.p. of the at least one silicon precursor or the difference between the b.p. of the solvent and the b.p. of the t least one silicon precursor is 40° C. or less, 30° C. or less, or 20° C. or less, or 10° C. or less. Alternatively, the difference between the boiling points ranges from any one or more of the following end-points: 0, 10, 20, 30, or 40° C. Examples of suitable ranges of b.p. difference include without limitation, 0 to 40° C., 20° C. to 30° C., or 10° C. to 30° C. Examples of suitable solvents in the compositions include, but are not limited to, an ether (such as 1,4-dioxane, dibutyl ether), a tertiary amine (such as pyridine, 1-methylpiperidine, 1-ethylpiperidine, N,N'-Dimethylpiperazine, N,N,N',N'-Tetramethylethylenediamine), a nitrile (such as benzonitrile), an alkane (such as octane, nonane, dodecane, ethylcyclohexane), an aromatic hydrocarbon (such as toluene, mesitylene), a tertiary aminoether (such as bis(2-dimethylaminoethyl) ether), or mixtures thereof.

As previously mentioned, the purity level of the at least one silicon precursor is sufficiently high enough to be acceptable for reliable semiconductor manufacturing. In certain embodiments, the at least one silicon precursor described herein comprise less than 2% by weight, or less than 1% by weight, or less than 0.5%, or less than 0.1%, or less than 0.01% (100 ppm), or 0.001% (10 ppm), or 0.0001 (1 ppm) % by weight of one or more of the following impurities: free amines, free halides or halogen ions such as chloride (Cl), bromide (Br), and higher molecular weight species. The impurity level of halides (Cl or Br) in the silicon precursor should be less than 100 ppm, 50 ppm, 20 ppm, 10 ppm, 5 ppm, or 1 ppm. Higher purity levels of the silicon precursor described herein can be obtained through one or more of the following processes: purification, adsorption, and/or distillation.

In one embodiment of the method described herein, a plasma enhanced cyclic deposition process such as PEALD-like or PEALD may be used wherein the deposition is conducted using the at least one silicon precursor and an oxygen-containing source. The PEALD-like process is defined as a plasma enhanced cyclic CVD process but still provides high conformal silicon oxide films.

In certain embodiments, the gas lines connecting from the precursor canisters to the reaction chamber are heated to one or more temperatures depending upon the process requirements and the container of the at least one silicon precursor is kept at one or more temperatures for bubbling. In other embodiments, a solution comprising the at least one silicon precursor is injected into a vaporizer kept at one or more temperatures for direct liquid injection.

A flow of argon and/or other gas may be employed as a carrier gas to help deliver the vapor of the at least one silicon precursor to the reaction chamber during the precursor pulsing. In certain embodiments, the reaction chamber process pressure is about 50 mTorr to 10 Torr. In other embodiments, the reaction chamber process pressure can be up to 760 Torr (e.g., about 50 mtorr to about 100 Torr).

In a typical PEALD or a PEALD-like process such as a PECCVD process, the substrate such as a silicon oxide substrate is heated on a heater stage in a reaction chamber that is exposed to the silicon precursor initially to allow the complex to chemically adsorb onto the surface of the substrate.

A purge gas such as argon purges away unabsorbed excess complex from the process chamber. After sufficient purging, an oxygen-containing source may be introduced into reaction chamber to react with the absorbed surface followed by another gas purge to remove reaction by-products from the chamber. The process cycle can be repeated to achieve the desired film thickness. In some cases, pumping can replace a purge with inert gas or both can be employed to remove unreacted silicon precursors.

In this or other embodiments, it is understood that the steps of the methods described herein may be performed in a variety of orders, may be performed sequentially, may be performed concurrently (e.g., during at least a portion of another step), and any combination thereof. The respective step of supplying the precursors and the oxygen-containing source gases may be performed by varying the duration of the time for supplying them to change the stoichiometric composition of the resulting dielectric film. Also, purge times after precursor or oxidant steps can be minimized to <0.1 s so that throughput is improved.

One particular embodiment of the method described herein to deposit a high quality silicon oxide film on a substrate at temperatures less than 300° C. comprises the following steps:
 a. providing a substrate in a reactor;
 b. introducing into the reactor at least one silicon precursor having the Formulae A or B wherein the silicon precursor having one $SiH_2$ group connected to an organoamino functionality described herein;
 c. purging reactor with purge gas to remove at least a portion of the unabsorbed precursors;
 d. introducing an oxygen-containing plasma source into the reactor and
 e. purging reactor with purge gas to remove at least a portion of the unreacted oxygen-containing source, wherein steps b through e are repeated until a desired thickness of the silicon oxide film is deposited. It is believed that the silicon precursor having one $SiH_2$ group is anchored onto a surface having hydroxyl group via releasing organoamine and the small $SiH_2$ groups allow more silicon fragments to be anchored compared the silicon precursor having SiHMe or $SiMe_2$ connected to an organoamino functionality, thus achieving growth rates higher than 1.5 Å/cycle.

Another particular embodiment of the method described herein to deposit a high quality silicon oxide film on a substrate at temperatures greater than 600° C. comprises the following steps:
 a. providing a substrate in a reactor;
 b. introducing into the reactor at least one silicon precursor having the Formulae A or B wherein $R^{3-8}$ and X are all methyl described herein;
 c. purging reactor with purge gas to remove at least a portion of the unabsorbed precursors;
 d. introducing an oxygen-containing plasma source into the reactor and
 e. purging reactor with purge gas to remove at least a portion of the unreacted oxygen-containing source, wherein steps b through e are repeated until a desired thickness of the silicon oxide film is deposited. It is believed that Si-methyl groups are stable at temperatures higher than 600° C., thus preventing any chemical vapor deposition due to thermal decomposition of the silicon precursors such as those having Si—H groups and allowing high temperature deposition of high quality silicon oxide possible.

Yet another method disclosed herein forms a carbon doped silicon oxide films using an organoaminodisiloxane compound or an organoaminotrisiloxane compound and an oxygen-containing source.

A still further exemplary process is described as follows:
 a. Providing a substrate in a reactor
 b. Contacting vapors generated from an organoaminodisiloxane compound or an organoaminotrisiloxane compound having Formulae A or B described herein with or without co-flowing an oxygen-containing source to chemically sorb the precursors on the heated substrate;
 c. Purging away any unabsorbed precursors;
 d. Introducing an oxygen-containing source on the heated substrate to react with the sorbed precursors; and,
 e. Purging away any unreacted oxygen-containing source, wherein steps b through e are repeated until a desired thickness is achieved.

Various commercial ALD reactors such as single wafer, semi-batch, batch furnace or roll to roll reactor can be employed for depositing the solid silicon oxide or carbon doped silicon oxide.

In one embodiment, process temperature for the method described herein use one or more of the following temperatures as endpoints: 0, 25, 50, 75, 100, 125, 150, 175, 200, 225, 250, 275, and 300° C. Exemplary temperature ranges include, but are not limited to the following: from about 0° C. to about 300° C.; or from about 25° C. to about 300° C.; or from about 50° C. to about 290° C.; or from about 25° C. to about 250° C., or from about 25° C. to about 200° C. In other embodiment, the process temperature for the method described herein use one or more of the following temperatures as endpoints: 300, 325, 350, 375, 400, 425, 450, 475, 500, 525, 550, 575, and 600° C. Yet, in other embodiment, the process temperature for the method described herein use one or more of the following temperatures as endpoints: 600, 625, 650, 675, 700, 725, 750, 775, and 800° C. Depending on the structures of the silicon precursors, some are suitable for deposition at temperatures less than 600° C. while others may be more suitable for temperatures higher than 600° C. For example, the silicon precursors having Formulae A or B wherein $R^3$ and $R^4$ are both hydrogen are suitable for deposition of high quality silicon oxide at temperatures less than 600° C., on the other hand, the silicon precursor having Formulae A or B wherein $R^{3-8}$ and X are all methyl groups can be used for deposition of high quality silicon oxide at temperatures ranging from room temperature to 800° C., especially for temperatures higher than 600° C. because Si-Me groups are more resistance to oxidation than Si—H groups. It is believed that Si-methyl groups are stable at temperatures higher than 600° C., thus preventing any chemical vapor deposition due to thermal decomposition of the silicon precursors such as those having Si—H groups and allowing high temperature deposition of high quality silicon oxide possible.

In a still further embodiment of the method described herein, the film or the as-deposited film is subjected to a treatment step. The treatment step can be conducted during at least a portion of the deposition step, after the deposition step, and combinations thereof. Exemplary treatment steps include, without limitation, treatment via high temperature thermal annealing; plasma treatment; ultraviolet (UV) light treatment; laser; electron beam treatment and combinations thereof to affect one or more properties of the film. The films deposited with the silicon precursors having Formulae A or B described herein, when compared to films deposited with previously disclosed silicon precursors under the same conditions, have improved properties such as, without limitation, a wet etch rate that is lower than the wet etch rate of the film before the treatment step or a density that is higher than the density prior to the treatment step. In one particular embodiment, during the deposition process, as-deposited films are intermittently treated. These intermittent or mid-deposition treatments can be performed, for example, after each ALD cycle, after every a certain number of ALD, such as, without limitation, one (1) ALD cycle, two (2) ALD cycles, five (5) ALD cycles, or after every ten (10) or more ALD cycles.

In an embodiment wherein the film is treated with a high temperature annealing step, the annealing temperature is at least 100° C. or greater than the deposition temperature. In this or other embodiments, the annealing temperature ranges from about 400° C. to about 1000° C. In this or other embodiments, the annealing treatment can be conducted in a vacuum (<760 Torr), inert environment or in oxygen containing environment (such as $H_2O$, $N_2O$, $NO_2$ or $C_2$).

In an embodiment wherein the film is treated to UV treatment, film is exposed to broad band UV or, alternatively, an UV source having a wavelength ranging from about 150 nanometers (nm) to about 400 nm. In one particular embodiment, the as-deposited film is exposed to UV in a different chamber than the deposition chamber after a desired film thickness is reached.

In an embodiment where in the film is treated with a plasma, passivation layer such as $SiO_2$ or carbon doped $SiO_2$ is deposited to prevent chlorine and nitrogen contamination to penetrate into film in the subsequent plasma treatment. The passivation layer can be deposited using atomic layer deposition or cyclic chemical vapor deposition.

In an embodiment wherein the film is treated with a plasma, the plasma source is selected from the group consisting of hydrogen plasma, plasma comprising hydrogen and helium, plasma comprising hydrogen and argon. Hydrogen plasma lowers film dielectric constant and boost the damage resistance to following plasma ashing process while still keeping the carbon content in the bulk almost unchanged.

It is believed that the silicon precursors having Formulae A or B can be anchored on substrate surface to provide Si—O—Si or Si—O—Si—O—Si fragments, thus boosting the growth rate of silicon oxide or carbon doped silicon oxide compared to conventional silicon precursors such as bis(tert-butylamino)silane or bis(diethylamino)silane having only one silicon atom. Importantly the as deposited Si—O—Si or Si—O—Si—O—Si fragments in a given pulse of the silicon precursors can provide better protection to the substrate, potentially avoiding or reducing substrate oxidation in the subsequent pulse of the oxygen-containing source during ALD process because conventional silicon precursors such as bis(tert-butylamino)silane or bis(diethylamino)silane can only provide a single layer of silicon fragments.

In certain embodiments, the silicon precursors having Formula A or B described herein can also be used as a dopant for metal containing films, such as but not limited to, metal oxide films or metal nitride films. In these embodiments, the metal containing film is deposited using an ALD or CVD process such as those processes described herein using metal alkoxide, metal amide, or volatile organometallic precursors. Examples of suitable metal alkoxide precursors that may be used with the method disclosed herein include, but are not limited to, group 3 to 6 metal alkoxide, group 3 to 6 metal complexes having both alkoxy and alkyl substituted cyclopentadienyl ligands, group 3 to 6 metal complexes having both alkoxy and alkyl substituted pyrrolyl ligands, group 3 to 6 metal complexes having both alkoxy and diketonate ligands; group 3 to 6 metal complexes having both alkoxy and ketoester ligands; Examples of suitable metal amide precursors that may be used with the method disclosed herein include, but are not limited to, tetrakis(dimethylamino)zirconium (TDMAZ), tetrakis(diethylamino)zirconium (TDEAZ), tetrakis(ethylmethylamino)zirconium (TEMAZ), tetrakis(dimethylamino)hafnium (TDMAH), tetrakis(diethylamino)hafnium (TDEAH), and tetrakis(ethylmethylamino)hafnium (TEMAH), tetrakis(dimethylamino)titanium (TDMAT), tetrakis(diethylamino)titanium (TDEAT), tetrakis(ethylmethylamino)titanium (TEMAT), tert-butylimino tri(diethylamino)tantalum (TBTDET), tert-butylimino tri(dimethylamino)tantalum (TBTDMT), tert-butylimino tri(ethylmethylamino)tantalum (TBTEMT), ethylimino tri(diethylamino)tantalum (EITDET), ethylimino tri(dimethylamino)tantalum (EITDMT), ethylimino tri(ethylmethylamino)tantalum (EITEMT), tert-amylimino tri(dimethylamino)tantalum (TAIMAT), tert-amylimino tri(diethylamino)tantalum, pentakis(dimethylamino)tantalum, tert-amylimino tri(ethylmethylamino) tantalum, bis(tert-butylimino)bis(dimethylamino)tungsten (BTBMW), bis(tert-butylimino)bis(diethylamino)tungsten, bis(tert-butylimino)bis(ethylmethylamino)tungsten, and combinations thereof. Examples of suitable organometallic precursors that may be used with the method disclosed herein include, but are not limited to, group 3 metal cyclopentadienyls or alkyl cyclopentadienyls. Exemplary Group 3 to 6 metals herein include, but not limited to, Y, La, Ce, Pr, Nd, Sm, Eu, Gd, Tb, Dy, Er, Yb, Lu, Ti, Hf, Zr, V, Nb, Ta, Cr, Mo, and W.

In certain embodiments, the resultant silicon-containing films or coatings can be exposed to a post-deposition treatment such as, but not limited to, a plasma treatment, chemical treatment, ultraviolet light exposure, electron beam exposure, and/or other treatments to affect one or more properties of the film.

In certain embodiments, the silicon-containing films described herein have a dielectric constant of 6 or less, 5 or less, 4 or less, and 3 or less. In these or other embodiments, the films can a dielectric constant of about 5 or below, or about 4 or below, or about 3.5 or below. However, it is envisioned that films having other dielectric constants (e.g., higher or lower) can be formed depending upon the desired end-use of the film. An example of silicon-containing film that is formed using the silicon precursors having Formula A or B precursors and processes described herein has the formulation $Si_xO_yC_zN_vH_w$ wherein Si ranges from about 10% to about 40%; O ranges from about 0% to about 65%; C ranges from about 0% to about 75% or from about 0% to about 50%; N ranges from about 0% to about 75% or from about 0% to 50%; and H ranges from about 0% to about 50% atomic percent weight % wherein x+y+z+v+w=100 atomic weight percent, as determined for example, by XPS or other means. Another example of the silicon containing film that is formed using the organoaminodisiloxane or organoaminotrisiloxane precursors having Formulae A or B and processes described herein is silicon carbonitride wherein the carbon content is from 1 at % to 80 at % measured by XPS. In yet, another example of the silicon containing film that is formed using the organoaminodisiloxanes or organoaminotrisiloxanes precursors having Formulae A or B and processes described herein is amorphous silicon wherein both sum of nitrogen and carbon contents is <10 at %, preferably <5 at %, most preferably <1 at % measured by XPS.

As mentioned previously, the method described herein may be used to deposit a silicon-containing film on at least a portion of a substrate. Examples of suitable substrates include but are not limited to, silicon, $SiO_2$, $Si_3N_4$, OSG, FSG, silicon carbide, hydrogenated silicon carbide, silicon nitride, hydrogenated silicon nitride, silicon carbonitride, hydrogenated silicon carbonitride, boronitride, antireflective coatings, photoresists, germanium, germanium-containing, boron-containing, Ga/As, a flexible substrate, organic polymers, porous organic and inorganic materials, metals such as copper and aluminum, and diffusion barrier layers such as but not limited to TiN, Ti(C)N, TaN, Ta(C)N, Ta, W, or WN. The films are compatible with a variety of subsequent processing steps such as, for example, chemical mechanical planarization (CMP) and anisotropic etching processes.

The deposited films have applications, which include, but are not limited to, computer chips, optical devices, magnetic information storages, coatings on a supporting material or substrate, microelectromechanical systems (MEMS), nano-electromechanical systems, thin film transistor (TFT), light emitting diodes (LED), organic light emitting diodes (OLED), IGZO, and liquid crystal displays (LCD). Potential use of resulting solid silicon oxide or carbon doped silicon oxide include, but not limited to, shallow trench insulation, inter layer dielectric, passivation layer, an etch stop layer, part of a dual spacer, and sacrificial layer for patterning.

The methods described herein provide a high quality silicon oxide or carbon-doped silicon oxide film. The term "high quality" means a film that exhibits one or more of the following characteristics: a density of about 2.1 g/cc or greater, 2.2 g/cc or greater, 2.25 g/cc or greater; a wet etch rate that is 2.5 Å/s or less, 2.0 Å/s or less, 1.5 Å/s or less, 1.0 Å/s or less, 0.5 Å/s or less, 0.1 Å/s or less, 0.05 Å/s or less, 0.01 Å/s or less as measured in a solution of 1:100 of HF to water dilute HF (0.5 wt % dHF) acid, an electrical leakage of about 1 or less e-8 A/cm$^2$ up to 6 MV/cm); a hydrogen impurity of about 5 e20 at/cc or less as measured by SIMS; and combinations thereof. With regard to the etch rate, a thermally grown silicon oxide film has 0.5 Å/s etch rate in 0.5 wt % Hf.

In certain embodiments, one or more silicon precursors having Formulae A or B described herein can be used to form silicon oxide films that are solid and are non-porous or are substantially free of pores.

The following examples illustrate the method for depositing silicon oxide films described herein and are not intended to limit it in any way.

EXAMPLES

Thermal atomic layer deposition of silicon oxide films were performed on a laboratory scale ALD processing tool. The silicon precursor was delivered to the chamber by vapor draw. All gases (e.g., purge and reactant gas or precursor and oxygen-containing source) were preheated to 100° C. prior to entering the deposition zone. Gases and precursor flow rates were controlled with ALD diaphragm valves with high speed actuation. The substrates used in the deposition were 12 inch long silicon strips. A thermocouple attached on the sample holder to confirm substrate temperature. Depositions were performed using ozone as oxygen-containing source gas. Normal deposition process and parameters are shown in Table 4. Thickness and refractive indices of the films were measured using a FilmTek 2000SE ellipsometer by fitting the reflection data from the film to a pre-set physical model (e.g., the Lorentz Oscillator model).

All plasma enhanced ALD (PEALD) was performed on a commercial style lateral flow reactor (300 mm PEALD tool manufactured by ASM) equipped with 27.1 MHz direct plasma capability with 3.5 mm fixed spacing between electrodes. The design utilizes outer and inner chambers which have independent pressure settings. The inner chamber is the deposition reactor in which all reactant gases (e.g. precursor, Ar) are mixed in the manifold and delivered to the process reactor. Ar gas is used to maintain reactor pressure in the outer chamber. All precursors were liquids maintained at room temperature in stainless steel bubblers and delivered to the chamber with Ar carrier gas, typically set at 200 sccm flow. All depositions reported in this study were done on native oxide containing Si substrates of 8-12 Ohm-cm. A Rudolph FOCUS Ellipsometer FE-IVD (Rotating Compensator Ellipsometer) was used to measure film thickness and refractive index (RI).

Example 1: Synthesis of
1-di-iso-propylamino-3,3,3-trimethyldisiloxane

A solution of potassium trimethylsilanolate in diethyl ether and THF was added dropwise to a stirred solution of 1 equivalent di-iso-propylaminochlorosilane in THF. After 20 minutes, the solid precipitate was removed by filtration and the filtrate was concentrated under reduced pressure. The resulting liquid contained 1-di-iso-propylamino-3,3,3-trimethyldisiloxane among other products as determined by GC-MS. GC-MS showed the following mass peaks: 219 (M+), 204 (M-15), 188, 174, 162, 146, 132, 119, 105, 89, 73, 59.

Example 2: Synthesis of 1,3-bis(dimethylamino)-1,
1,3,3-tetramethyldisiloxane

A solution of trimethylamine and dimethylamine in THF and hexanes was chilled to below 0° C. 1,3-dichlorotetramethyldisiloxane was slowly added dropwise to the this solution while stirring. The solids were removed by filtration and the filtrate was purified by vacuum distillation to provide 1,3-bis(dimethylamino)-1,1,3,3-tetramethyldisiloxane (56° C./5 Torr). GC-MS showed the following mass peaks: 220 (M+), 205 (M-15), 196, 175, 162, 146, 133, 119, 102.

Examples 3-10: Synthesis of Additional
Organoaminodisiloxanes, or
Organoaminotrisiloxanes Additional organoaminodisiloxanes, or organoaminotrisiloxanes were synthesized via similar fashion as described in Examples 1 and 2 and were characterized by GC-MS. The molecular weight (MW), the structure, and corresponding major MS fragmentation peaks of each compound are provided in Table 3 to confirm their identification.

TABLE 3

| | Organoaminodisiloxanes and Organoaminotrisiloxanes | | | |
|---|---|---|---|---|
| Ex. | Precursor Name | MW | Structure | MS Peaks |
| 3 | 1,3-Bis(tert-butylamino)-disiloxane | 220.46 | 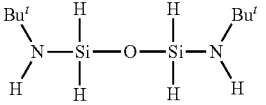 | 220, 205, 189, 178, 147, 132, 118, 107 |

TABLE 3-continued

Organoaminodisiloxanes and Organoaminotrisiloxanes

| Ex. | Precursor Name | MW | Structure | MS Peaks |
|---|---|---|---|---|
| 4 | 1,3-bis(di-isopropylamino)-1,3-dimethyldisiloxane | 304.62 | $Pr^i\text{-}N(Pr^i)\text{-}Si(Me)(H)\text{-}O\text{-}Si(Me)(H)\text{-}N(Pr^i)\text{-}Pr^i$ | 304, 289, 202, 188, 160, 146, 119, 105 |
| 5 | 1,3-Bis(diethylamino)-1,1,3,3-tetramethyldisiloxane | 276.57 | $Et\text{-}N(Et)\text{-}Si(Me)(Me)\text{-}O\text{-}Si(Me)(Me)\text{-}N(Et)\text{-}Et$ | 276, 261, 245, 231, 204, 190, 174, 160, 133, 119 |
| 6 | 1-Disecbutylamino-3-chloro-1,1,3,3-tetramethyldisiloxane | 296.00 | $Bu^s\text{-}N(Bu^s)\text{-}Si(Me)(Me)\text{-}O\text{-}Si(Me)(Me)\text{-}Cl$ | 295, 281, 265, 249, 235, 221, 207, 193, 177, 163, 147, 133, 119, 103 |
| 7 | 1,5-Bis(tert-butylamino)trisiloxane | 266.56 | $Bu^t\text{-}N(H)\text{-}Si(H)(H)\text{-}O\text{-}Si(H)(H)\text{-}O\text{-}Si(H)(H)\text{-}N(H)\text{-}Bu^t$ | 266, 251, 243, 235, 224, 193, 178, 153, |
| 8 | 1,5-bis(di-iso-propylamino)-1,3,5-trimethyltrisiloxane | 364.75 | $Pr^i\text{-}N(Pr^i)\text{-}Si(Me)(H)\text{-}O\text{-}Si(Me)(H)\text{-}O\text{-}Si(Me)(H)\text{-}N(Pr^i)\text{-}Pr^i$ | 364, 349, 362, 248, 220, 206, 180, 165, 149, 133, 119, 105 |
| 9 | 1-dimethylamino-1,1,3,3,3-pentamethyldisiloxane | 191.42 | $Me\text{-}N(Me)\text{-}Si(Me)(Me)\text{-}O\text{-}Si(Me)(Me)\text{-}Me$ | 191, 176, 160, 147, 133, 117, 103, 88 |
| 10 | 1-dimethylamino-1,3,3,3-tetramethyldisiloxane | 177.39 | $Me\text{-}N(Me)\text{-}Si(H)(Me)\text{-}O\text{-}Si(Me)(Me)\text{-}Me$ | 177, 162, 146, 133, 119, 103, 89 |

Comparative Example 11a: Thermal Atomic Layer Deposition of Silicon Oxide Films with Dimethylaminotrimethylsilane (DMATMS)

Atomic layer deposition of silicon oxide films were conducted using the following precursor: DMATMS. The depositions were performed on the laboratory scale ALD processing tool. The silicon precursor was delivered to the chamber by vapor draw. Deposition process and parameters are provided in Table 4. Steps 1 to 6 are repeated until a desired thickness is reached. At 500° C., with the DMATMS precursor dose time of 8 seconds and ozone flow for 4 seconds, the film growth rate per cycle measured was 1.24 Å/cycle and film refractive index was 1.43.

Example 11: Atomic Layer Deposition of Silicon Oxide Films with 1,3-Bis(Dimethylamino)-1,1,3,3-Tetramethyldisiloxane Atomic layer deposition of silicon oxide films were conducted using the following precursors: 1,3-Bis(Dimethylamino)-1,1,3,3-Tetramethyldisiloxane. The depositions were performed on the laboratory scale ALD processing tool. The silicon precursor was delivered to the chamber by vapor draw. Deposition process and parameters are provided in Table 4. Steps 1 to 6 are repeated until a desired thickness is reached.

TABLE 4

Process for Atomic Layer Deposition of Silicon Oxide Films with Oxygen Source Using DMATMS.

| Step 1 | 6 sec | Evacuate reactor | <100 mT |
|---|---|---|---|
| Step 2a | variable | Dose Silicon precursor | Reactor pressure typically < 2 Torr |
| Step 2b | 6 sec | Purge reactor with nitrogen | Flow 1.5 slpm $N_2$ |
| Step 2c | 6 sec | Evacuate reactor | <100 mT |
| Step 3 | variable | Dose oxygen source ozone | |
| Step 4 | 6 sec | Purge reactor with nitrogen | Flow 1.5 slpm $N_2$ |

The process parameters of the depositions, the deposition rate and refractive index are provided in Table 5.

TABLE 5

Summary of Process Parameters and Results for 1,3-Bis(Dimethylamino)-1,1,3,3-Tetramethyldisiloxane

| Wafer temperature (Celcius) | Precursor dose (seconds) | Ozone dose (seconds) | Deposition Rate (Å/cycle) | Refractive Index |
|---|---|---|---|---|
| 300 | 12 + 12 | 10 | 1.58 | 1.46 |
| 500 | 12 | 10 | 1.53 | 1.54 |
| 600 | 12 + 12 | 10 | 1.65 | 1.43 |
| 650 | 12 | 10 | 1.66 | 1.45 |
| 700 | 12 | 10 | 2.00 | 1.45 |

It can be seen that precursor, 1,3-Bis(Dimethylamino)-1,1,3,3-tetramethyldisiloxane with Si—O—Si linkage, provides higher growth rate per cycle compare to precursor DMATMS without the Si—O—Si linkage.

The film deposited at 650° C. and 700° C. composition were analyzed by SIMS. Film WER is done in 1:99 diluted HF solution and thermal oxide wafers were used as reference. The SIMS analysis data and relative WER is shown in Table 6. The film shows low C, H, N impurities and low WER, indicating high quality films are obtained.

TABLE 6

SIMS analysis and relative WER to thermal oxide for 1,3-bis(dimethylamino)-1,1,3,3-tetramethyldisiloxane deposited at 650° C. and 700° C.

| Precursor | Dep T (° C.) | C | H | N | Relative WER to thermal oxide |
|---|---|---|---|---|---|
| 1,3-bis(dimethylamino)-1,1,3,3-tetramethyldisiloxane | 650 | 2.8E+19 | 1.9E+21 | 6.9E+18 | 3.4 |
| 1,3-bis(dimethylamino)-1,1,3,3-tetramethyldisiloxane | 700 | 1.0E+19 | 8.8E+20 | 6.6E+18 | 3.3 |

Comparative Example 10a: PEALD Silicon Oxide Using Dimethylaminotrimethylsilane (DMATMS)

Depositions were done with DMATMS as Si precursor and $O_2$ plasma under conditions given in Table 7. DMATMS as Si precursor was delivered by vapor draw at ambient temperature (25° C.). The vessel is equipped with orifice with diameter of 0.005" to limit precursor flow.

TABLE 7

PEALD Parameters for Silicon Oxide Using DMATMS

| Step | | |
|---|---|---|
| A | Introduce Si wafer to the reactor | Deposition temperature = 100° C. |
| B | Introduce Si precursor to the reactor | Precursor pulse = 4 seconds; Argon flow = 300 sccm Reactor pressure = 3 Torr |
| C | Purge Si precursor with inert gas (argon) | Argon flow = 300 sccm Argon flow time = 2 seconds Reactor pressure = 3 Torr |
| D | Oxidation using plasma | Argon flow = 300 sccm Oxygen flow = 100 sccm Plasma power = 200 W Plasma time = 2 seconds Reactor pressure = 3 Torr |
| E | Purge $O_2$ plasma | Plasma off Argon flow = 300 sccm Argon flow time = 0.5 seconds Reactor pressure = 3 Torr |

Steps b to e were repeated 500 times to get a desired thickness of silicon oxide for metrology. With the Si precursor pulse of 4 seconds, film growth rate measured to be around 0.8 Å/cycle for different precursor pulse time.

Example 12: PEALD Silicon Oxide Using 1,3-Bis(Dimethylamino)-1,1,3,3-Tetramethyldisiloxane Depositions were done with 1,3-Bis(Dimethylamino)-1,1,3,3-Tetramethyldisiloxane as Si precursor and $O_2$ plasma under conditions given in Table 8. 1,3-Bis(Dimethylamino)-1,1,3,3-Tetramethyldisiloxane as Si precursor was delivered by carrier gas at ambient temperature (25° C.).

TABLE 8

PEALD Parameters for Silicon Oxide Using 1,3-Bis(Dimethylamino)-1,1,3,3-Tetramethyldisiloxane

| Step | | |
|---|---|---|
| A | Introduce Si wafer to the reactor | Deposition temperature = 100° or 300° C. |
| B | Introduce Si precursor to the reactor | Precursor pulse = variable seconds; Carrier gas Argon flow = 200 sccm Process gas Argon flow = 300 sccm Reactor pressure = 3 Torr |
| C | Purge Si precursor with inert gas (argon) | Argon flow = 300 sccm Argon flow time = 2 seconds Reactor pressure = 3 Torr |
| D | Oxidation using plasma | Argon flow = 300 sccm Oxygen flow = 100 sccm Plasma power = 200 W Plasma time = 2 seconds Reactor pressure = 3 Torr |
| E | Purge O$_2$ plasma | Plasma off Argon flow = 300 sccm Argon flow time = 0.5 seconds Reactor pressure = 3 Torr |

Steps b to e were repeated 200 times to get a desired thickness of silicon oxide for metrology. The film growth rate and refractive index are shown in Table 9.

TABLE 9

Summary of PEALD Process Parameters and Results for 1,3-Bis(Dimethylamino)-1,1,3,3-Tetramethyldisiloxane

| Wafer temperature (Celcius) | Precursor dose (seconds) | Growth Rate (Å/cycle) | Refractive Index |
|---|---|---|---|
| 100 | 1 | 1.05 | 1.47 |
| 100 | 4 | 1.84 | 1.50 |
| 100 | 8 | 1.85 | 1.50 |
| 300 | 1 | 1.36 | 1.46 |
| 300 | 2 | 1.44 | 1.46 |
| 300 | 4 | 1.48 | 1.52 |

It can be seen that 1,3-Bis(Dimethylamino)-1,1,3,3-Tetramethyldisiloxane with Si—O—Si linkage gives higher growth rate per cycle compared to precursor dimethylaminotrimethylsilane without Si—O—Si linkage.

Example 13: Atomic Layer Deposition of Silicon Oxide Films with 1-dimethylamino-1,1,3,3,3-pentamethyldisiloxane Atomic layer deposition of silicon oxide films were conducted using the following precursors: 1-dimethylamino-1,1,3,3,3-pentamethyldisiloxane. The depositions were performed on the laboratory scale ALD processing tool. The silicon precursor was delivered to the chamber by vapor draw. Deposition process and parameters are provided in Table 4. Steps 1 to 6 are repeated until a desired thickness is reached. The process parameters of the depositions, the deposition rate and refractive index are provided in Table 10.

TABLE 10

Summary of Process Parameters and Results for 1-dimethylamino-1,1,3,3,3-pentamethyldisiloxane.

| Wafer temperature (Celcius) | Precursor dose (seconds) | Ozone dose (seconds) | Deposition Rate (Å/cycle) | Refractive Index | Relative WER to thermal oxide |
|---|---|---|---|---|---|
| 300 | 12 | 10 | 1.77 | 1.45 | 9.2 |
| 400 | 12 | 10 | 2.16 | 1.44 | 8.3 |
| 650 | 12 | 10 | 1.92 | 1.44 | 3.2 |
| 650 | 12 | 20 | 1.91 | 1.45 | 3.8 |
| 700 | 12 | 10 | 2.10 | 1.44 | 2.8 |
| 700 | 12 | 20 | 2.07 | 1.45 | 3.1 |

The high temperature deposited (≥650° C.) films' composition analysis is shown in Table 11.

TABLE 11

SIMS composition analysis of film deposited by 1-dimethylamino-1,1,3,3,3-pentamethyldisiloxane

| Wafer temperature (Celcius) | Ozone Time (s) | C | H | N |
|---|---|---|---|---|
| 700 | 10 | 2.52E+19 | 2.81E+20 | 8.38E+17 |
| 700 | 20 | 1.65E+19 | 2.29E+20 | 5.55E+17 |

TABLE 11-continued

SIMS composition analysis of film deposited by
1-dimethylamino-1,1,3,3,3-pentamethyldisiloxane

| Wafer temperature (Celcius) | Ozone Time (s) | C | H | N |
|---|---|---|---|---|
| 650 | 10 | 2.75E+19 | 4.76E+20 | 1.35E+18 |
| 650 | 20 | 1.59E+19 | 5.81E+20 | 1.86E+18 |

It can be seen that precursor, 1-dimethylamino-1,1,3,3,3-pentamethyldisiloxane with Si—O—Si linkage, provides higher growth rate per cycle compared to precursor DMATMS without the Si—O—Si linkage. The film deposited at high temperature has low C, N, H impurities and low relative WER to thermal oxide, indicating high quality films were obtained.

The conformality of the film deposited at 650° C. was studied by TEM. The samples were imaged with a FEI Tecnai TF-20 FEG/TEM operated at 200 kV in bright-field (BF) TEM mode, high-resolution (HR) TEM mode, and high-angle annular dark-field (HAADF) STEM mode. The STEM probe size was 1-2 nm nominal diameter. The film surface coverage was 102% in the middle side and 97% at the bottom, confirming excellent step coverage for structured feature.

Example 14: PEALD Silicon Oxide Using 1,5-Bis(dimethylamino)-1,1,3,3,5,5-hexamethyltrisiloxane Depositions were done with 1,5-Bis(dimethylamino)-1,1,3,3,5,5-hexamethyltrisiloxane as Si precursor and $O_2$ plasma under conditions given in Table 12. 1,5-Bis(dimethylamino)-1,1,3,3,5,5-hexamethyltrisiloxane as Si precursor was delivered by carrier gas at 70° C.

TABLE 12

PEALD Parameters for Silicon Oxide Using 1,5-Bis(dimethylamino)-1,1,3,3,5,5-hexamethyltrisiloxane.

| Step | | |
|---|---|---|
| a | Introduce Si wafer to the reactor | Deposition temperature = 100° or 300° C. |
| b | Introduce Si precursor to the reactor | Precursor pulse = variable seconds; Carrier gas Argon flow = 200 sccm Process gas Argon flow = 300 sccm Reactor pressure = 3 Torr |
| c | Purge Si precursor with inert gas (argon) | Argon flow = 300 sccm Argon flow time = 2 seconds Reactor pressure = 3 Torr |
| d | Oxidation using plasma | Argon flow = 300 sccm Oxygen flow = 100 sccm Plasma power = 200 W Plasma time = 5 seconds Reactor pressure = 3 Torr |
| e | Purge $O_2$ plasma | Plasma off Argon flow = 300 sccm Argon flow time = 2 seconds Reactor pressure = 3 Torr |

Steps b to e were repeated 200 times to get a desired thickness of silicon oxide for metrology. The film growth rate and refractive index are shown in Table 13.

TABLE 13

Summary of PEALD Process Parameters and Results for 1,5-Bis(dimethylamino)-1,1,3,3,5,5-hexamethyltrisiloxane.

| Wafer temperature (Celcius) | Precursor dose (seconds) | Growth Rate (Å/cycle) | Refractive Index |
|---|---|---|---|
| 100 | 8 | 2.37 | 1.45 |
| 100 | 16 | 2.40 | 1.44 |
| 300 | 8 | 1.93 | 1.46 |

It can be seen that 1,5-Bis(dimethylamino)-1,1,3,3,5,5-hexamethyltrisiloxane with Si—O—Si linkage gives higher growth rate per cycle compare to precursor dimethylamino-trimethylsilane without Si—O—Si linkage.

Although certain principles of the invention have been described above in connection with aspects or embodiments, it is to be clearly understood that this description is made only by way of example and not as a limitation of the scope of the invention.

The invention claimed is:

1. A method of depositing a film comprising silicon and oxygen onto a substrate, the method comprising the steps of:
   a) providing a substrate in a reactor;
   b) introducing into the reactor at least one silicon precursor compound, wherein the at least one silicon precursor compound is selected from the group consisting of Formulae A and B:

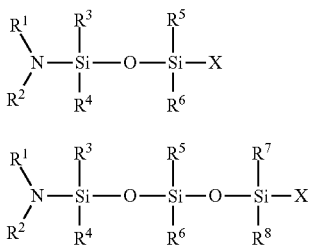

wherein
R$^1$ is independently selected from the group consisting of a linear C$_1$ to C$_{10}$ alkyl group, a branched C$_3$ to C$_{10}$ alkyl group, a C$_3$ to C$_{10}$ cyclic alkyl group, a C$_3$ to C$_{10}$ heterocyclic group, a C$_3$ to C$_{10}$ alkenyl group, a C$_3$ to C$_{10}$ alkynyl group, and a C$_4$ to C$_{10}$ aryl group;

R$^2$ is selected from the group consisting of hydrogen, a C$_1$ to C$_{10}$ linear alkyl group, a branched C$_3$ to C$_{10}$ alkyl group, a C$_3$ to C$_{10}$ cyclic alkyl group, a C$_3$ to C$_{10}$ heterocyclic group, a C$_3$ to C$_{10}$ alkenyl group, a C$_3$ to C$_{10}$ alkynyl group, and a C$_4$ to C$_{10}$ aryl group, wherein R$^1$ and R$^2$ in Formula A or B are either linked to form a cyclic ring structure or are not linked to form a cyclic ring structure;

R$^{3-8}$ are each independently selected from the group consisting of hydrogen, a linear C$_1$ to C$_{10}$ alkyl group, a branched C$_3$ to C$_{10}$ alkyl group, a C$_3$ to C$_{10}$ cyclic alkyl group, a C$_2$ to C$_{10}$ alkenyl group, a C$_2$ to C$_{10}$ alkynyl group, and a C$_4$ to C$_{10}$ aryl group;

X is selected from the group consisting of hydrogen, a linear C$_1$ to C$_{10}$ alkyl group, a branched C$_3$ to C$_{10}$ alkyl group, a C$_3$ to C$_{10}$ cyclic alkyl group, a C$_2$ to C$_{10}$ alkenyl group, a C$_2$ to C$_{10}$ alkynyl group, and a C$_4$ to C$_{10}$ aryl group, wherein R$^1$ and R$^9$ are either linked to form a cyclic ring or are not linked to form a cyclic ring, and wherein both of R$^3$ and R$^4$ are not hydrogen;

c) purging the reactor with purge gas;
d) introducing an oxygen-containing source into the reactor; and
e) purging the reactor with purge gas,
wherein steps b through e are repeated until a desired thickness of the film is deposited, and
wherein the method is conducted at one or more temperatures ranging from about 600° C. to about 800° C.

2. The method of claim 1, wherein the at least one silicon precursor compound is at least one selected from the group consisting of 1-dimethylamino-1,1,3,3,3-pentamethyldisiloxane, 1-diethylamino-1,1,3,3,3-pentamethyldisiloxane, 1-di-iso-propylamino-1,1,3,3,3-pentamethyldisiloxane, 1-di-sec-butylamino-1,1,3,3,3-pentamethyldisiloxane, 1-pyrrolyl-1,1,3,3,3-pentamethyldisiloxane, 1-pyrrolidino-1,1,3,3,3-pentamethyldisiloxane, 1-piperidino-1,1,3,3,3-pentamethyldisiloxane, 1-(2,6-dimethylpiperidino)-3,3,3-pentamethyldisiloxane, 1-dimethylamino-1,1,3,3,5,5,5-heptamethyltrisiloxane, 1-diethylamino-1,1,3,3,5,5,5-heptamethyltrisiloxane, 1-di-iso-propylamino-1,1,3,3,5,5,5-heptamethyltrisiloxane, 1-sec-butylamino-1,1,3,3,5,5,5-heptamethyltrisiloxane, 1-cyclohexylmethylamino-1,1,3,3,5,5,5-heptamethyltrisiloxane, 1-cyclohexylethylamino-1,1,3,3,5,5,5-heptamethyltrisiloxane, 1-piperidino-1,1,3,3,5,5,5-heptamethyltrisiloxane, 1-(2,6-dimethylpiperidino)-1,1,3,5,5,5-heptamethyltrisiloxane, 1-pyrrolyl-1,1,3,3,5,5,5-heptamethyltrisiloxane, and 1-pyrrolidino-1,1,3,3,5,5,5-heptamethyltrisiloxane.

3. The method of claim 1, wherein the oxygen-containing source is selected from the group consisting of an oxygen plasma, a plasma comprising oxygen and argon, a plasma comprising oxygen and helium, an ozone plasma, a water plasma, a nitrous oxide plasma, a carbon dioxide plasma, a carbon monoxide plasma, and combinations thereof.

4. The method of claim 1 wherein the oxygen-containing source comprises plasma.

5. The method of claim 4 wherein the plasma is generated in situ.

6. The method of claim 4 wherein the plasma is generated remotely.

7. The method of claim 4 wherein the film has a density of about 2.1 g/cc or greater.

8. The method of claim 1 wherein the film further comprises carbon.

9. The method of claim 8 wherein the film has a density of about 1.8 g/cc or greater.

10. The method of claim 8 wherein a carbon content of the film is 0.5 atomic weight percent (at. %) as measured by x-ray photospectroscopy or greater.

11. The method of claim 1 wherein the at least one silicon precursor compound is selected from the group consisting of 1-dimethylamino-1,1,3,3,3-pentamethyldisiloxane, 1-diethylamino-1,1,3,3,3-pentamethyldisiloxane, and 1-pyrrolidino-1,1,3,3,3-pentamethyldisiloxane.

12. The method of claim 11 wherein the at least one silicon precursor compound is 1-dimethylamino-1,1,3,3,3-pentamethyldisiloxane.

13. The method of claim 1 wherein the at least one silicon precursor compound is substantially free of halide ions.

14. The method of claim 13 wherein the at least one silicon precursor compound comprises less than 5 ppm of halide ions.

15. The method of claim 14 wherein the at least one silicon precursor compound comprises less than 3 ppm of halide ions.

16. The method of claim 15 wherein the at least one silicon precursor compound comprises less than 1 ppm of halide ions.

17. The method of claim 16 wherein the at least one silicon precursor compound is free of halide ions.

18. A method of depositing a film comprising silicon and oxygen onto a substrate comprises steps of:
a) providing a substrate in a reactor;
b) introducing into the reactor at least one silicon precursor compound, wherein the at least one silicon precursor compound is selected from the group consisting of Formulae A and B:

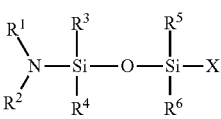

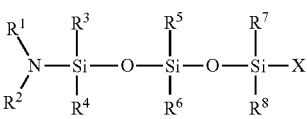

wherein
- $R^1$ is independently selected from the group consisting of a linear $C_1$ to $C_{10}$ alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group;
- $R^2$ is selected from the group consisting of hydrogen, a $C_1$ to $C_{10}$ linear alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group, wherein $R^1$ and $R^2$ in Formula A or B are either linked to form a cyclic ring structure or are not linked to form a cyclic ring structure; and
- $R^{3-8}$ and X are methyl;
- c) purging the reactor with purge gas;
- d) introducing an oxygen-containing source into the reactor; and
- e) purging the reactor with purge gas,
wherein steps b through e are repeated until a desired thickness of the film is deposited, and
wherein the method is conducted at one or more temperatures ranging from about 600° C. to about 800° C.

19. The method of claim 18, wherein the at least one silicon precursor compound is at least one selected from the group consisting of 1-dimethylamino-1,1,3,3,3-pentamethyldisiloxane, 1-diethylamino-1,1,3,3,3-pentamethyldisiloxane, 1-di-iso-propylamino-1,1,3,3,3-pentamethyldisiloxane, 1-di-sec-butylamino-1,1,3,3,3-pentamethyldisiloxane, 1-pyrrolyl-1,1,3,3,3-pentamethyldisiloxane, 1-pyrrolidino-1,1,3,3,3-pentamethyldisiloxane, 1-piperidino-1,1,3,3,3-pentamethyldisiloxane, 1-(2,6-dimethylpiperidino)-3,3,3-pentamethyldisiloxane, 1-dimethylamino-1,1,3,3,5,5,5-heptamethyltrisiloxane, 1-diethylamino-1,1,3,3,5,5,5-heptamethyltrisiloxane, 1-di-iso-propylamino-1,1,3,3,5,5,5-heptamethyltrisiloxane, 1-sec-butylamino-1,1,3,3,5,5,5-heptamethyltrisiloxane, 1-cyclohexylmethylamino-1,1,3,3,5,5,5-heptamethyltrisiloxane, 1-cyclohexylethylamino-1,1,3,3,5,5,5-heptamethyltrisiloxane, 1-piperidino-1,1,3,3,5,5,5-heptamethyltrisiloxane, 1-(2,6-dimethylpiperidino)-1,1,3,3,5,5,5-heptamethyltrisiloxane, 1-pyrrolyl-1,1,3,3,5,5,5-heptamethyltrisiloxane, and 1-pyrrolidino-1,1,3,3,5,5,5-heptamethyltrisiloxane.

20. The method of claim 18, wherein the at least one silicon precursor compound is at least one selected from the group consisting of 1-dimethylamino-1,1,3,3,3-pentamethyldisiloxane, 1-diethylamino-1,1,3,3,3-pentamethyldisiloxane, and 1-pyrrolidino-1,1,3,3,3-pentamethyldisiloxane.

21. The method of claim 20 wherein the at least one silicon precursor compound is 1-dimethylamino-1,1,3,3,3-pentamethyldisiloxane.

22. The method of claim 18 wherein the at least one silicon precursor compound is substantially free of halide ions.

23. The method of claim 22 wherein the at least one silicon precursor compound comprises less than 5 ppm of halide ions.

24. The method of claim 23 wherein the at least one silicon precursor compound comprises less than 3 ppm of halide ions.

25. The method of claim 24 wherein the at least one silicon precursor compound comprises less than 1 ppm of halide ions.

26. The method of claim 25 wherein the at least one silicon precursor compound is free of halide ions.

* * * * *